(12) United States Patent
Nanbu et al.

(10) Patent No.: US 8,345,767 B2
(45) Date of Patent: Jan. 1, 2013

(54) VIDEO ENCODING METHOD, VIDEO ENCODING DEVICE, AND VIDEO ENCODING PROGRAM

(75) Inventors: Tetsuhiro Nanbu, Tokyo (JP); Keiichi Chono, Tokyo (JP)

(73) Assignee: NEC Corporation, Tokyo (JP)

( * ) Notice: Subject to any disclaimer, the term of this patent is extended or adjusted under 35 U.S.C. 154(b) by 605 days.

(21) Appl. No.: 12/443,734

(22) PCT Filed: Dec. 10, 2007

(86) PCT No.: PCT/JP2007/073769
§ 371 (c)(1),
(2), (4) Date: Mar. 31, 2009

(87) PCT Pub. No.: WO2008/072592
PCT Pub. Date: Jun. 19, 2008

(65) Prior Publication Data
US 2010/0238998 A1    Sep. 23, 2010

(30) Foreign Application Priority Data
Dec. 14, 2006    (JP) .................................. 2006-337468

(51) Int. Cl.
*H04N 11/02*  (2006.01)
*G06K 9/46*  (2006.01)

(52) U.S. Cl. .......... 375/240.23; 375/240.24; 375/240.03; 382/247

(58) Field of Classification Search . 375/240.01–240.29
See application file for complete search history.

(56) References Cited

U.S. PATENT DOCUMENTS

| 6,639,942 | B1 | 10/2003 | Bayazit |
| 7,590,179 | B2 * | 9/2009 | Mukerjee .................. 375/240.15 |
| 7,599,435 | B2 * | 10/2009 | Marpe et al. ............. 375/240.16 |
| 2006/0176953 | A1 | 8/2006 | Mohsenian |

FOREIGN PATENT DOCUMENTS

| JP | 2004048607 A | 2/2004 |
| JP | 2004166254 A | 6/2004 |
| JP | 2005300933 A | 10/2005 |
| JP | 2006093777 A | 4/2006 |
| WO | 2007043609 A1 | 4/2007 |

OTHER PUBLICATIONS

International Search Report for PCT/JP2007/073769 mailed Feb. 5, 2008.
ITU-T H.264 "Advanced video coding for generic audiovisual services", Mar. 2005, p. 250-254.

(Continued)

*Primary Examiner* — David Czekaj
*Assistant Examiner* — Leron Beck

(57) ABSTRACT

A video encoding method comprises the steps of converting syntax data of an image block into a binary sequence; encoding each symbol of the binary sequence subject to its corresponding context; estimating the number of bits required for the binary arithmetic encoding of the syntax data of the image block; deciding whether to encode the syntax data of the image block to output it responding to the estimated bit number; and updating the context corresponding the syntax data decided to be encoded and to be outputted and not updating the context corresponding to the syntax data decided not to be encoded and not to be outputted. The estimating step uses the maximum value of the number of arithmetic encoding output bits for its input symbols as the aforementioned number of bits.

12 Claims, 13 Drawing Sheets

OTHER PUBLICATIONS

Supplementary European Search Report for EP 07 85 0343 issued Dec. 13, 2011.
E. Viscito et al., "Macroblock level limit on the number of binary symbols in CABAC" Joint Video Team (JVT) of ISO/IEC MPEG & ITU-T VCEG, JVT-F054, Dec. 2002, pp. 1-6.
J. Ribas-Corbera et al., "International Organisation for Satandardisation Organisation Internationale De Normalisation ISO/IEC JTC1/SC29/WG11 Coding of Moving Pictures and Audio", ISO/IEC JTC1/SC29/WG11, MPEG97/M2418, Jul. 1997, pp. 1-12.

* cited by examiner

VIDEO ENCODING METHOD, VIDEO ENCODING DEVICE, AND VIDEO ENCODING PROGRAM

This application is the National Phase of PCT/JP2007/073769, filed Dec. 10, 2007, which is based upon and claims the benefit of priority from Japanese patent application No. 2006-337468, filed on Dec. 14, 2006, the disclosure of which is incorporated herein in its entirety by reference.

APPLICABLE FIELD IN THE INDUSTRY

The present invention relates to a video encoding method, a video encoding device, and a video encoding program that utilize a CABAC (Context-based Adaptive binary Arithmetic Coding) technology based upon a table-driven binary arithmetic coding engine.

BACKGROUND ART

The video encoding device, after digitalizing moving image signals being inputted from the outside, performs an encoding process in accordance with a predetermined image encoding technique, thereby to generate syntax data, i.e. bit streams.

There exists ITU-T Recommendation H.264/AVC (Advanced Video Coding) as one of image encoding techniques (see Non-patent document 1). The H.264/AVC is equivalent to ISO/IEC 14496-10 AVC. The H.264/AVC is for subjecting a syntax element (SE), being coding data of a macroblock (MB) layer or a lower ranking layer to entropy encoding by selecting CAVLC (Context-based Adaptive Variable Length Coding), being a Huffman coding scheme, or CABAC (Context-based Adaptive binary Arithmetic Coding), being an arithmetic coding scheme. Additionally, the SE of the MB layer is described in 7.3.5 Macroblock layer syntax of the Non-patent document 1. Further, hereinafter, the matter stipulated in the H.264/AVC is called an H.264 specification.

It is said that selecting CABAC for the entropy encoding yields a coding quantity reduction effect of 15% or so on the average as compared with the case of selecting the CAVLC. Further, the encoder of a Joint Model technique is known as a reference model of an H.264/AVC encoder (hereinafter, referred to as a general-purpose video encoding device).

A configuration and an operation of the general-purpose video encoding device that outputs a bit stream with a digitalized image frame taken as an input will be explained by making a reference to FIG. 9. The video encoding device shown in FIG. 9 includes an original image frame buffer 10, an MB encoding device 20, a rate controlling device 30, and a decoded image frame buffer 40. With regard to a QCIF (Quarter Common Intermediate Format) image frame, the original image frame buffer 10 stores image data shown in FIG. 10. The image frame is divided into luminance pixels of a 16.times.16 pixel block that are called an MB, and pixel blocks having color difference pixels (Cr and Cb) of an 8.times.8 pixel block as a component.

The MB encoding device 20, as a rule, encodes the MB in an order of a luster scan reaching from upper left to lower right of the image frame.

The rate controlling device 30 monitors the output bit number of the bit streams that the MB encoding device 20 outputs, regulates a quantized parameter being supplied to the MB encoding device 20, and takes a rate controls so that the number of the bit streams approaches a target bit number. Specifically, when the bit number of the bit streams becomes larger than a target bit number, the rate controlling device 30 supplies the quantized parameter of which a quantization width is larger to the MB encoding device 20, and contrarily, when the bit number of the bit streams becomes smaller than a target bit number, the rate controlling device 30 supplies the quantized parameter of which a quantization width is smaller to the MB encoding device 20.

The decoded image frame buffer 40 loads and stores a decoded image by the MB encoding device 20 at a timing that the MB encoding device 20 has completed the encoding of one MB in order to utilize it for succeeding encoding (prediction).

Next, an internal configuration and an operation of the MB encoding device 20 will be explained. As shown in FIG. 9, the MB encoding device 20 includes a read device 210, a predicting device 220, a video encoding (Venc) device 230, and an entropy encoding (EC) device 240. The read device 210 includes an original image MB memory 211 and a reference image memory 212. The video encoding device 230 includes a converter/quantizer 231, an inverse quantizer/inverse converter 232, and a decoded image MB memory 233. The entropy encoding device 240 includes an entropy encoder 241, an output buffer 242, a controlling device 243, and a context duplication memory 244.

The to-be-encoded images of the MB (hereinafter, referred to as an original image org), out of the image frames stored in the original image frame buffer 10, are stored in the original image MB memory 211. The images necessary for predicting and encoding the to-be-encoded MB (hereinafter, referred to as a reference image ref), out of the image frames stored in the decoded image frame buffer 40, are stored in the reference image memory 212.

The predicting device 220 detects a prediction parameter param, which enables the original image to be preferredly encoded, from the reference images stored in the decoded image frame buffer 40 and the decoded image MB memory 233, and generates a prediction image pred and a prediction error image pe. The prediction parameter is supplied to the entropy encoder 241. The prediction error image pe is supplied to the converter/quantizer 231. The prediction error image pe, which is added to an output of the inverse quantizer/inverse converter 232, is stored as a decoded image in the decoded image MB memory 233. However, when a necessity for original image PCM (Pulse Code Modulation) re-encoding to be later described has arisen, the original image being supplied from the original image MB memory 211 is stored as a decoded image in the decoded image MB memory 233.

There exist two kinds of predictions, i.e. an intra-frame prediction and an inter-frame prediction. The prediction image and the prediction error image in the intra-frame prediction/inter-frame prediction will be explained. When the intra-frame prediction is carried out, the predicting device 220 makes a reference to a past decoded image of which a display time is identical to that of the current to-be-encoded image frame, utilizes a correlation of the pixels within the image frame (a spatial direction), and generates the prediction image pred. Various patterns of the intra-frame prediction in a 4.times.4 pixel block size in which the MB has been yet finely divided are shown as one example in an explanatory view of FIG. 11 (for the intra-frame prediction in the case of the color difference and others, see 8.3 section Intra prediction process of the Non-patent document 1).

Each intra_dir in FIG. 11(A) to (I) is an intra-screen predictive-direction parameter indicative of a direction etc. of the intra-frame prediction. The predicting device 220, when selecting the intra-frame prediction, generates the prediction image pred according to the intra-screen predictive-direction parameter intra_dir. For convenience of the succeeding explanation, the intra-frame prediction is defined as Equation 1.

$$pred=intra\_prediction(ref, intra\_dir) \qquad \text{[Numerical equation 1]}$$

In Equation 1, intra_prediction ( ) is a function for generating an intra-frame prediction image from the reference image ref according to the intra-screen predictive-direction parameter intra_dir.

When the inter-frame prediction is carried out, the predicting device 220 makes a reference to the past decoded image of which the display time differs from that of the current to-be-encoded image frame, utilizes a correlation within the image frames (a temporal direction), and generates the prediction image pred. The inter-frame prediction of a 16.times.16 pixel block size will be explained as one example of the inter-frame prediction by making a reference to an explanatory view of FIG. 12 (for the inter-frame prediction of the other pixel block sizes, see 8.4 section Intra prediction process of the Non-patent document 1).

Each of movement vectors mv_x and mv_y shown in FIG. 12 is a prediction parameter of the inter-frame prediction. The predicting device 220, when selecting the inter-frame prediction, generates the prediction image pred according to the movement vectors mv_x and mv_y. For convenience of the succeeding explanation, the inter-frame prediction is defined as Equation 2.

$$pred=inter\_prediction(ref, mv\_x, mv\_y) \qquad \text{[Numerical equation 2]}$$

In Equation 2, inter_prediction ( ) is a function for generating an inter-frame prediction image from the reference image ref according to the movement vectors mv_x and mv_y. Additionally, the H.264 specification stipulates that a pixel precision of the movement vector is one quarter pixel.

The predicting device 220 utilizes cost functions (predictive evaluation values) of Equation 3, and Equation 4 to Equation 7, and detects the prediction parameter param for generating the foregoing prediction image pred. The so-called prediction parameter is the intra-screen predictive-direction intra_dir with the intra-frame prediction, and is the movement vectors mv_x and mv_y, etc. with the inter-frame prediction (for other prediction parameters, see 7 section Syntax and semantics of the Non-patent document 1). A difference between the prediction image pred corresponding to the detected prediction parameter param, and the original image org is called a prediction error image pe (see Equation 6).

$$\text{Cost}(param) = \sum_{idx=0}^{15} SATD(idx) + \lambda(QP) \times R(param) \qquad \text{[Numerical equation 3]}$$

$$SATD(idx) + 0.5 \times \sum_{x=0}^{3} \sum_{y=0}^{3} | H(idx)_{xy} \qquad \text{[Numerical equation 4]}$$

$$H(idx) = \begin{bmatrix} 1 & 1 & 1 & 1 \\ 1 & 1 & -1 & -1 \\ 1 & -1 & -1 & 1 \\ 1 & -1 & 1 & -1 \end{bmatrix} \qquad \text{[Numerical equation 5]}$$

$$\begin{bmatrix} pe_{idx}(0,0) & pe_{idx}(0,1) & pe_{idx}(0,2) & pe_{idx}(0,3) \\ pe_{idx}(1,0) & pe_{idx}(1,1) & pe_{idx}(1,2) & pe_{idx}(1,3) \\ pe_{idx}(2,0) & pe_{idx}(2,1) & pe_{idx}(2,2) & pe_{idx}(2,3) \\ pe_{idx}(3,0) & pe_{idx}(3,1) & pe_{idx}(3,2) & pe_{idx}(3,3) \end{bmatrix}$$

$$\begin{bmatrix} 1 & 1 & 1 & 1 \\ 1 & 1 & -1 & -1 \\ 1 & -1 & -1 & 1 \\ 1 & -1 & 1 & -1 \end{bmatrix}$$

$$pe_{idx}(y,x) = \qquad \text{[Numerical equation 6]}$$
$$org(b4y_{idx}+y, b4x_{idx}+x) - pred(b4y_{idx}+y, b4x_{idx}+x)$$

$$\lambda(QP) = 2^{(QP-12)/6} \qquad \text{[Numerical equation 7]}$$

$$(b4x_{idx}, b4y_{idx})\{0 \leq b4x_{idx} \leq 12, 0 \leq b4y_{idx} \leq 12\} \qquad \text{[Numerical equation 8]}$$

Additionally, Equation 3 is an equation for explaining the calculation of the predictive evaluation value in the H.264. Equation 4 is an equation for explaining the calculation of SATD(idx) in Equation 3. Equation 5 is an equation for explaining the calculation of H(idx) in Equation 4. Equation 6 is an equation for explaining the calculation of peidx(y,x) in Equation 5. Equation 7 is an equation for explaining the calculation of λ(QP) in Equation 3. Equation 8 is an equation for explaining b4x and b4y in Equation 6. Further, QP in Equation 3 to Equation 7 is a quantized parameter of the MB, idx is a number of a 4.times.4 block inside the MB shown in FIG. 10, and b4x and b4y are indicative of coordinates inside the MB of an upper left corner of the 4.times.4 block that corresponds to idx.

Next, the converter/quantizer 231 subjects the prediction error pe being supplied from the predicting device 220 to a frequency transformation in a unit of the block finer than the MB (hereinafter, referred to as a conversion block), and converts (transforms) a region thereof from a space region into a frequency region. The prediction error image of which the region has been converted into a frequency region is called a conversion coefficient T.

In addition hereto, the converter/quantizer 231 quantizes the conversion coefficient T with a quantization width that corresponds to the quantized parameter QP being supplied from the rate controlling device 30. The quantized conversion coefficient, as a rule, is called a transformed-quantized value L. The transformed-quantized value L is supplied to the inverse quantizer/inverse converter 232 for a purpose of the succeeding encoding, and is supplied to the entropy encoding device 240 in order to form a bit stream.

A succeeding operation will be explained by paying an attention to the transformed-quantized value L being supplied to the inverse quantizer/inverse converter 232.

The inverse quantizer/inverse converter 232 subjects the transformed-quantized value L being supplied from the converter/quantizer 231 to an inverse quantization, and further to an inverse frequency transformation, thereby to return the region thereof to the original space region. The prediction error image of which region has been return to the original space region is called a restructure prediction error image pe_rec.

The restructure prediction error image pe_rec being supplied from the inverse quantizer/inverse converter 232, to which the prediction image pred being supplied from the predicting device 220 has been added as shown in Equation 9 for explaining the reference image in the H.264 specification, is stored as a decoded image rec in the decoded image MB memory 233. The decoded image rec stored in the decoded image MB memory 233, subsequent to it, is loaded into the predicting device 220 or the decoded image frame buffer 40, and becomes a reference image.

$$rec = pred + pe\_rec \quad \text{[Numerical equation 9]}$$

Next, a succeeding operation will be explained by paying an attention to the transformed-quantized value L being supplied to the entropy encoding device 240.

The entropy encoding device 240 includes an entropy encoder 241, an output buffer 242, a controlling device 243, and a context duplication memory 244. The entropy encoder 241 subjects input data to entropy encoding, and supplies output bits to the output buffer 242. The controlling device 243 monitors the number of the output bis of the entropy encoder 241, and controls an operation of the other devices. The context duplication memory 244 is a memory for storing duplication of context data that is later described.

The controlling device 243 monitors the number of the output bits of the entropy encoder 241, and controls the entropy encoder 241 and the output buffer 242 by use of control signals (an entropy encoding control signal and an output buffer signal).

When, even though the controlling device 243 subjects input data of all of one BM to the entropy encoding, its output bit number does not exceed an upper-limit bit number being stipulated in the H.264 specification (Upon making a reference to Annex AA.3 Levels of the Non-patent document 1, it is 3,200 bits), the controlling device 243 outputs the bits stored in the output buffer 242 as syntax data of the MB by use of the output buffer control signal. Additionally, the upper-limit bit number per one MB that is stipulated in the H.264 specification is, hereinafter, referred to as a stipulation value.

At the moment that the number of the output bits obtained by subjecting the input data of one MB to the entropy encoding exceeds the stipulation value of the MB bit number, the controlling device 243 stops an operation of the entropy encoder 241 by use of the entropy encoding control signal for the time being, and cancels all bits of the output buffer 242 by use of the output buffer control signal. That is, contents of the output buffer 242 at this time point are not regarded as syntax data. The controlling device 243, after cancelling the bits, starts the entropy encoder 241 by use of the entropy encoding control signal, and causes entropy encoder 241 to re-encode the input image data so that the bit number becomes equal to or less than the stipulation vale.

Next, an internal configuration and an operation of the entropy encoder 241 in the case of having selected the CABAC as entropy encoding will be explained. As shown in FIG. 13, the entropy encoder 241 is configured of an entropy encoding unit 2416 including a binarizing device 2411, a binary arithmetic encoding device 2412, and a context modeling device 2413, a switch 2414, and a switch 2415.

A PCM re-encoding operation in the entropy encoding device will be explained.

The entropy encoder 241, at first, stops a process of subjecting the input data to the entropy encoding for the time being. Next, it loads the context data preserved in the context duplication memory 244 into the context modeling device 2413. Thereafter, the binarizing device 2411 generates a bin (binary symbol) of the prediction parameter indicative of a commencement of the PCM, and supplies it to the binary arithmetic encoding device 2412. Simultaneously therewith, the context modeling device 2413 supplies the context data corresponding to the bin to the binary arithmetic encoding device 2412. The binary arithmetic encoding device 2412 subjects the bin to the arithmetic encoding by employing the context data, and returns the context data updated by the arithmetic encoding to the context modeling device 2413 while writing out the output bit to the output buffer 242 via the switch 2415. After the binary arithmetic encoding device 2412 finishes subjecting the bin of the prediction parameter indicative of a commencement of the PCM to the arithmetic encoding, it make a switchover of the switch 2414, loads the image stored in the original image MB memory 211, re-encodes it without changing a status of the PCM image, and writes out it to the output buffer 242.

The process of re-encoding the original image for which the above-mentioned conversion process, being a process of re-encoding, has not been applied with the PCM is called an original image PCM re-encoding process (see Patent document 1). It is said that utilizing the original image PCM re-encoding process makes it possible to guarantee not only the entropy encoding device of the encoding device but also the entropy decoding device in the decoding side for keeping the processing time thereof at a level of a certain constant time because the image that is completely unconvertible and unpredictable can be encoded without distortion and yet with a constant bit number equal to less than the stipulation value of the MB bit number.

Further, there exists the method of predicting the MB output bit number of the MB prior to the CABAC and making a switchover to the PCM encoding employing the encoded image as a method of observing the stipulation value of the MB bit number without being accompanied by the re-encoding (see Patent document 2).

Next, the encoding process of the CABAC will be explained in details.

As shown in FIG. 19, for example, the general-purpose entropy encoder for realizing the CABAC is configured of a binarizer 101, a switch 111, a binary arithmetic encoder 102, and a context modeler 103. Additionally, a configuration shown in FIG. 14 is equivalent to the configuration of the entropy encoder 2416 shown in FIG. 13. The context modeler 103 is initialized before performing the MB process for a slice head by employing a first QP of the MB (see 9.3.1 Initialization process of the Non-patent document 1).

The binarizer 101 converts the SE being inputted into a binary sequence according to a rule stipulated with the specification (for a correspondence between the SE and the binary sequence conversion, see 9.3.2 Binarization process of the Non-patent document 1). Next, the binary arithmetic encoder 102 subjects each symbol (bin) of the binary sequence being supplied from the binarizer 101 to the binary arithmetic encoding by utilizing the context (more probable symbol (MPS)) being supplied from context modeler 103 and a state index (state_idx).

Additionally, the MPS of the context corresponds to valMPS in the non-patent document 1, and state_idx to pStateIdx in the non-patent document 1. As a rule, in the binary arithmetic encoding, a numerical line [0.1] is divided responding to an occurrence probability ρ of the symbol, and the binary decimal value of a representative point of a final partial block is outputted with the bits as a final coding language. An operational example of the usual binary arithmetic encoding for a three-symbol input (110) is shown in FIG. 15.

In the binary arithmetic encoding of the H.264 specification, an occurrence probability (rLPS(i)) of a less-probable-symbol (LPS) at the time of processing the current bin corresponds to ρ in FIG. 15. rLPS(i) can be expressed with the following Equation 10.

$$rLPS(i) = \text{range Tab LRS}[state\_idx][qCodIrangeIdx]/Rrange(i) \quad \text{[Numerical equation 10]}$$

Herein, it is assumed that Erange(i) (which corresponds to codIRange in the Non-patent document 1) is an arithmetic range at the time of processing the current bin, qCodIRangeIdx(i) is an arithmetic range index being obtained from higher bits of Erange(i), and rangeTabLPS[64][4] (which corresponds to table 9-35 in the Non-patent document 1) is a less-probable-symbol range table (see 9.3.4 Arithmetic encoding process (informative) of the Non-patent document 1).

The binary arithmetic encoder 102 performs a process equivalent to the execution of Equation 11 and Equation 12 described below by employing rLPS(i) (see 9.3.4.2 Encoding process for a binary decision (informative) of the Non-patent document 1), thereby completing the process of the binary arithmetic encoding for one bin. Herein, it is assumed that Elow(i) (which corresponds to codILow in the non-patent document 1) is an arithmetic lower-limit at the time of processing the current bin. There exits Bypass encoding as well in which rLPS(i) always becomes a fixed value (see 9.3.4.4 Bypass Encoding process for a binary decisions (informative) of the Non-patent document 1).

$$Erange(i+1) = \begin{cases} Erange(i) - rLPS(i) & \wedge \text{ if } (bin = MPS) \\ rLPS(i) & \wedge \text{ otherwise.} \end{cases} \quad \text{[Numerical equation 11]}$$

$$Elow(i+1) = \begin{cases} Elow(i) & \wedge \text{ if } (bin = MPS) \\ Erange(i) - rLPS(i) & \wedge \text{ otherwise.} \end{cases} \quad \text{[Numerical equation 12]}$$

Further, in the binary arithmetic encoding of the H.264 specification, so as to carry out the arithmetic encoding that meets an occurrence frequency of the input symbol, whenever the binary arithmetic encoding of one bin is completed, the MPS of the context utilized for the binary arithmetic encoding of the bin is updated with following Equation 13, and simultaneously therewith, a value of state_idx of the context is updated according to a state transit table (Table 9-36 of the Non-patent document 1).

$$MPS = \begin{cases} 1 - MPS & \wedge \text{ (state\_idx} = 0 \text{ AND} bin \ne MPS) \\ MPS & \wedge \quad \text{Otherwise.} \end{cases} \quad \text{[Numerical equation 13]}$$

As described above, the binary arithmetic encoding of the H.264 specification, which is for managing a probability of the less-probable-symbol with the less-probable-symbol table and the state transit table, is called table-driven binary arithmetic coding.

Successively subjecting all bins being inputted to the foregoing binary arithmetic encoding allows the arithmetic encoding output bit (bit stream) to be obtained.

Patent document 1: JP-P2006-93777A
Patent document 2: Japanese Patent Application No. 2005-300933
Non-patent document 1: ITC-T Recommendation H.264 Advanced video coding for generic audiovisual services, may, 2005 (Prepublished Version)

DISCLOSURE OF THE INVENTION

Problems to be Solved by the Invention

The present invention has been accomplished in order to solve above-mentioned problems, and an a first object thereof is to provide a method of estimating the maximum value of the number of the output bits of the CABAC by taking a fluctuation in the output bit due to the arithmetic range and the context into consideration. An estimation precision concerning the estimation of the number of the MB output bits of the CABAC is not sufficiently taken into consideration in the patent document 2 proposing the method of observing the stipulation value of the MB bit number without being accompanied by the PCM re-encoding. Specifically, the method described in the Patent document 2 has a problem that it is impossible to take a fluctuation in the output bit number due to the arithmetic encoding range and the context into consideration because the number of the MB output bits of the CABAC is estimated by applying a simplified linear calculation for the number of the input symbols (bins) of the CABAC.

The present invention has been accomplished in order to solve above-mentioned problems, and a second object thereof is to provide a method of flexibly selecting the preferred estimation method responding to the bin of the CABAC and the context, thereby to estimate the output bit number. While applying the high-precision estimation method for all bins in the estimation in which a fluctuation in the output bit number is taken into consideration enables the estimation with the highest reliability, another problem that the area of the device, and the process quantity of the calculation are increased arises.

That is, the present invention has an object of providing a video encoding method, a video encoding device and a video encoding program for estimating the maximum value of the number of the arithmetic encoding output bits for one symbol or a plurality of symbols at a high-precision, and subjecting them to the video encoding while taking a fluctuation in the output bit number due to the arithmetic range and the context into consideration.

Yet, the present invention has an object of providing a video encoding method, a video encoding device and a video encoding program that enable an arithmetic quantity accompanying the estimation of the output bit number to be reduced, and the output bit number to be estimated at a high precision.

Means to Solve the Problem

The present invention for solving the above-mentioned problems is a video encoding method, comprising: a binary-sequence conversion step of converting syntax data of an image block into a binary sequence; a binary arithmetic encoding step of encoding each symbol of the binary sequence subject to its corresponding context; an estimation step of estimating a bit number required for binary arithmetic encoding of the syntax data of the image block; a coded data decision step of deciding whether or not to encode the syntax data of the image block in said binary arithmetic encoding step and to output it responding to the bit number estimated in said estimation step; and a context update step of updating said context corresponding to the syntax of the image block data decided to be encoded in said binary arithmetic encoding step and to be outputted in said coded data decision step, and not updating said context corresponding to the syntax data of the image block decided not to be encoded in said binary arithmetic encoding step and not to be outputted in said coded data decision step, wherein, in said estimation step, a maximum value of the number of binary arithmetic encoding output bits for its input symbol is defined as said number of bits.

The present invention for solving the above-mentioned problems is a video encoding device, comprising: a binary-sequence conversion unit for converting syntax data of an image block into a binary sequence; a binary arithmetic encoding unit for encoding each symbol of the binary sequence subject to its corresponding context; an estimation unit for estimating a bit number required for binary arithmetic encoding of the syntax data of the image block; a coded data decision unit for deciding whether or not said binary arithmetic encoding unit encodes the syntax data of the image block and outputs it responding to the bit number estimated by said estimation unit; and a context update unit for updating said context corresponding to the syntax data of the image block that said coded data decision unit has decided to encode and to output, and not updating said context corresponding to the syntax data that said coded data decision unit has decided not to encode and not to output, wherein said estimation unit defines a maximum value of the number of arithmetic encoding output bits for its input symbols as said number of bits.

The present invention for solving the above-mentioned problems is a video encoding program causing a computer to execute: a binary-sequence conversion process of converting syntax data of an image block into a binary sequence; a binary arithmetic encoding process of encoding each symbol of the binary sequence subject to its corresponding to context; an estimation process of estimating a bit number required for binary arithmetic encoding of the syntax data of the image block; and a coded data decision process of deciding whether or not to encode the syntax data of the image block in said binary arithmetic encoding process and to output it responding to the bit number estimated in said estimation process: wherein said video encoding program, in said coded data decision process, causes the computer to execute a context update process of updating said context corresponding to the syntax data of the image block decided to be encoded in said binary arithmetic encoding process and to be outputted in said coded data decision process, and not updating said context corresponding to the syntax data decided not to be encoded in said binary arithmetic encoding process and not to be outputted in said coded data decision process; and wherein said video encoding program, in said estimation process, causes the computer to execute a process of defining a maximum value of the number of arithmetic encoding output bits for its input symbol as said number of bits.

An Advantageous Effect of the Invention

A first effect of the present invention is to provide a video encoding method, a video encoding device and a video encoding program that enable the output bit number in the arithmetic encoding of the CABAC to be estimated at a high reliability degree. The reason is that a fluctuation in the output bit number can be evaluated according to the range of the arithmetic encoding and the context.

A second effect of the present invention is that employing the high-reliability evaluation of the output bit number, which exhibits the first effect, as a method etc. of observing the stipulation value of the MB bit number without being accompanied by the re-encoding in the video encoding method of the H.264 specification makes it possible to provide a video encoding method, a video encoding device and a video encoding program of the high-quality H.264 specification. The reason is that an extra margin for the stipulation value of the MB bit number can be reduced because the high-reliability evaluation is applicable, for example, it becomes possible to suppress a use of such observation means of the stipulation value that causes the image quality of the encoded video to deteriorate by use of the method etc. of roughing the quantized parameter.

Figure 1:
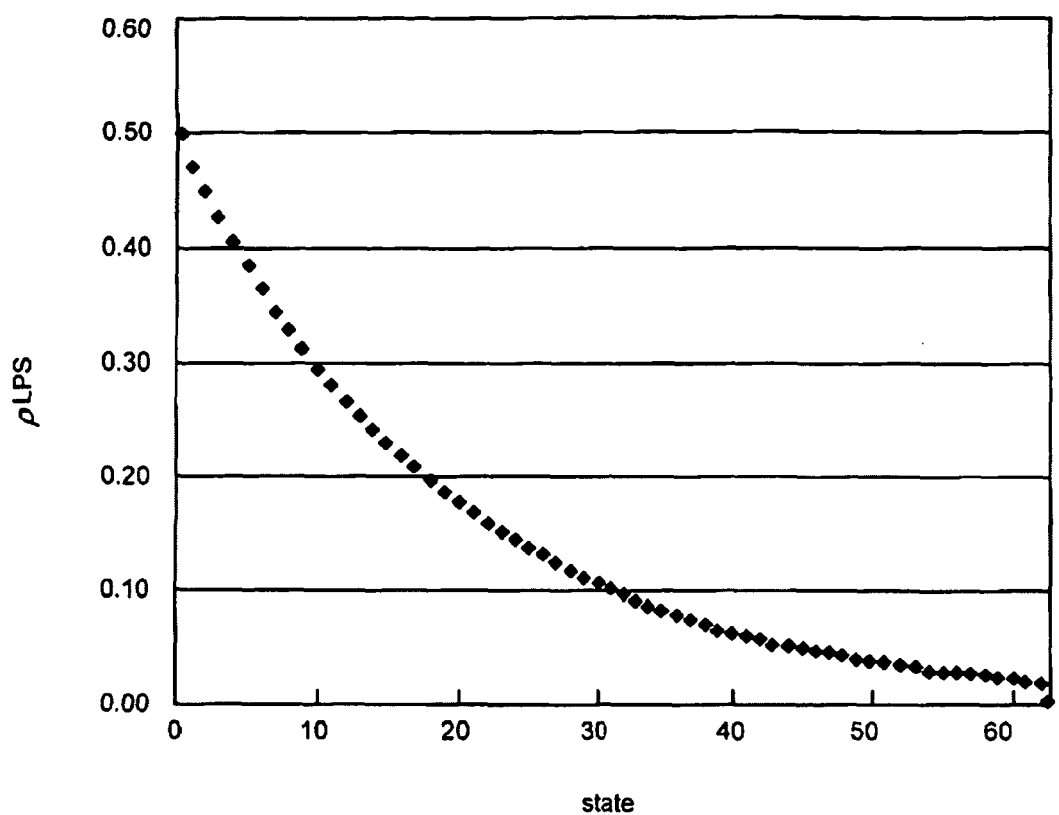
FIG. 1 is a view for explaining a relation of state_idx and ρLPS in the CABAC.

DESCRIPTION OF NUMERALS 101 binarizer
102 binary arithmetic encoder
103 context modeler
104 bin buffer
105 binary arithmetic encoding maximum bit number calculator
106 second context modeler

107 context duplication memory
110 switcher (PCM re-encoding switch)
1050 binary arithmetic encoding maximum bit number calculator
1051 one-bin unit calculator
1052 plural-bin unit calculator
1053 accumulation calculator
1054 switcher (unit calculator switch)
1055 switcher (accumulation calculator switch)

BEST MODE FOR CARRYING OUT THE INVENTION

Embodiments of the present invention will be explained.

As described above, employing rLPS(i) makes it possible to calculate a number (cabac_bits(i)) of the momentary arithmetic encoding output bits for the current bin (i-th bin) with Equation 14 by comparing the current bin with the MPS. Equation 14 is an equation for calculating the number of the bits that are outputted from one bin in the CABAC.

$$\text{cabac\_bits}(i) = \begin{cases} \log_2(rLPS(i)) - 1 & \wedge \text{ if } (bin = MPS) \\ \log_2(-rLPS(i)) & \wedge \text{ otherwise.} \end{cases} \qquad \text{[Numerical equation 14]}$$

Herein, the H.264 specification pays an attention to two points, i.e. a point that Erange (i) is expressed with a fixed 9-bit precision and a point that rangeTabLPS[64] [4] is a fixed value stipulated by the specification. Whereupon, even though a value of the future arithmetic range Erange(i) falls into an unsettled condition (condition 1), a maximum vale (max_rLPS(state_idx) and a minimum vale (min_rLPS (state_idx) that rLPS(i) is able to assume for state_idx of the context are settled. That is, a maximum vale (max_cabac_bits (i)) of cabac_bits(i) for the current bin can be accurately calculated with Equation 15. Equation 15 is an equation for calculating the maximum value of the number of the bits that are outputted from one bin under the condition 1 in the CABAC.

$$\text{max\_cabac\_bits}(i) = \begin{cases} \log_2(\text{max\_rLPS}(\text{state\_idx}) - 1) & \wedge \text{ if } (bin = MPS) \\ \log_2(-\text{min\_rLPS}(\text{state\_idx})) & \wedge \text{ otherwise.} \end{cases} \qquad \text{[Numerical equation 15]}$$

That is, in the CABAC, state_idx of the context and the MPS are initialized in the first MB, and an intermediate buffer for storing the bin is installed between the binarization and the binary arithmetic encoding, thereby making it possible to accurately calculate the bin being stored in the intermediate buffer, i.e. the maximum value of the number of the arithmetic encoding output bits for the SE of the MB layer with a calculation of an Equation 15 and a state_idx transit calculation according to a state transit table for each bin stored in the intermediate buffer prior to the binary arithmetic encoding.

In addition hereto, upon paying an attention to two points, i.e. a point that state_idx is managed according to the state transit table in the H.264 specification even though not only a future arithmetic range Erange(i) but also state_idx of a future context are under an unsettled condition (condition 2), and further, a point that rLPS for state_idx is continuously changed (in FIG. 1, ρLPS in the longitudinal axis of a graph corresponds to rLPS), it follows that the maximum value (max_sum_cabac_bits) of the number of the arithmetic encoding output bits for plural bins under the condition 2 is a total of the number of the bits that occur due to the LPS being continuously inputted until the value of state_idx at this time point becomes zero, and the number of the bits that occur due to the MPS continuing to be inverted in a state of state=0. Additionally, FIG. 1 is a view for explaining a relation of state_idx (traverse axis) and ρLPS (longitudinal axis) in the CABAC. Upon defining the bin number, the value of state_idx at the current time point, and the maximum bin number during a transit from state=s0 to state=0 due to the LPS being continuously inputted as B, s0 (s0=62 becomes a maximum output bit number), and L, respectively, max_sum_cabac_bits can be calculated with Equation 16 and Equation 17. Additionally, Equation 18, being a simplified Equation 16, may be employed because the maximum value of F(ρ) is 1(ρ=0.5). Equation 16 is an equation for calculating the maximum value of number of the bits that are outputted from plural bins under the condition 2 in the CABAC. Equation 17 is an equation for calculating F(ρ) in Equation 16.

$$\text{Max\_sum\_cabac\_bits} = \begin{cases} \log_2\left(-\prod_{state=s0}^{L} \text{min\_rLPS}(state)\right) + (B-L) * F(\text{min\_rLPS}(0)) & \wedge \text{ if } (B > L) \\ \log_2\left(-\prod_{state=s0}^{B} \text{min\_rLPS}(state)\right) & \wedge \text{ otherwise.} \end{cases} \qquad \text{[Numerical equation 16]}$$

$$F(\rho) = \rho \log_2(-\rho) + (1-\rho)\log_2(-(1-\rho)) \qquad \text{[Numerical equation 17]}$$

$$\text{Max\_sum\_cabac\_bits} = \begin{cases} \log_2\left(-\prod_{state=s0}^{L} \text{min\_rLPS}(state)\right) + (B-L) & \wedge \text{ if } (B > L) \\ \log_2\left(-\prod_{state=s0}^{B} \text{min\_rLPS}(state)\right) & \wedge \text{ otherwise.} \end{cases} \qquad \text{[Numerical equation 18]}$$

The first clause of each of Equation 16 and Equation 18, which is a product of the minimum values of rLPS(state) of each state in a predetermined state transit period, is a minimum value of a product of rLPS(state) in a predetermined state transit period.

Upon summarizing the matters above,

The maximum value of the number of the arithmetic encoding output bits for one bin can be calculated with Equation 15 even though the value of the future arithmetic range Erange(i) is unsettled.

It can be seen that the maximum value of the number of the arithmetic encoding output bits for plural bins can be calculated with Equation 16 or Equation 18 even though not only the future arithmetic range Erange(i) but also state_idx of the future context is unsettled.

The present invention, based the above-mentioned two facts, realizes the arithmetic encoding output bit number estimation method of, in the video encoding method, the video encoding device, and the video encoding program, estimating the maximum value of the number of the arithmetic encoding output bits for one bin or plural bins at a high precision by taking a fluctuation in the output bit number due to the arithmetic range and the context into consideration.

The present invention is a video encoding method, comprising: a binary-sequence conversion step of converting syntax data of an image block into a binary sequence; a binary arithmetic encoding step of encoding each symbol of the binary sequence subject to its corresponding context; an estimation step of estimating a bit number required for binary arithmetic encoding of the syntax data of the image block; a coded data decision step of deciding whether or not to encode the syntax data of the image block in said binary arithmetic encoding step and to output it responding to the bit number estimated in said estimation step; and a context update step of updating said context corresponding to the syntax data of the image block decided to be encoded in said binary arithmetic encoding step and to be outputted in said coded data decision step, and not updating said context corresponding to the syntax data of the image block decided not to be encoded in said binary arithmetic encoding step and not to be outputted in said coded data decision step, wherein, in said estimation step, a maximum value of the number of binary arithmetic encoding output bits for its input symbols is defined as said number of bits.

The video encoding method is characterized in that: in the estimation step, the maximum value of the number of the arithmetic encoding output bits is obtained on the basis of one-symbol-unit calculation of a minimum value of less-probable-symbol occurrence probabilities.

The video encoding method is characterized in that: in the estimation step, the maximum value of the number of the arithmetic encoding output bits is obtained on the basis of plural-symbol-unit calculation of a minimum value of a product of less-probable-symbol occurrence probabilities in a case where less-probable-symbols occur successively.

The video encoding method is characterized in that: in the estimation step, the maximum value of the number of the arithmetic encoding output bits is obtained on the basis of one-symbol-unit calculation of a minimum value of less-probable-symbol occurrence probabilities, and plural-symbol-unit calculation of a minimum value of a product of less-probable-symbol occurrence probabilities in a case where less-probable-symbols occur successively.

The video encoding method comprises: a conversion-quantization step of calculating transformed-quantized values of an image block by applying a frequency transformation followed by a quantization; and a non-entropy encoding step of non-entropy-encoding the image of the image block and outputting obtained data: wherein, in the coded data decision step, when the estimated bit number exceeds a predetermined value, a PCM mode header is decided as syntax data that is outputted; and wherein, after said PCM mode header has been encoded in the binary arithmetic encoding step and outputted, the reconstructed image obtained by reconstructing said transformed-quantized values, or the input image of the image block prior to said conversion-quantization step is encoded in said non-entropy encoding step, and obtained PCM data is outputted.

The present invention is a video encoding device, comprising: a binary-sequence conversion unit for converting syntax data of an image block into a binary sequence; a binary arithmetic encoding unit for encoding each symbol of the binary sequence subject to its corresponding context; an estimation unit for estimating a bit number required for binary arithmetic encoding of the syntax data of the image block; a coded data decision unit for deciding whether or not said binary arithmetic encoding unit encodes the syntax of the image block and outputs it responding to the bit number estimated by said estimation unit; and a context update unit for updating said context corresponding to the syntax data of the image block that said coded data decision unit has decided to encode and to output, and not updating said context corresponding to the syntax data that said coded data decision unit has decided not to encode and not to output, wherein said estimation unit defines a maximum value of the number of arithmetic encoding output bits for its input symbols as said number of bits.

The video encoding device is characterized in that: the estimation unit obtains the maximum value of the number of the arithmetic encoding output bits on the basis of one-symbol-unit calculation of a minimum value of less-probable-symbol occurrence probabilities.

The video encoding device is characterized in that: the estimation unit obtains the maximum value of the number of the arithmetic encoding output bits on the basis of plural-symbol-unit calculation of a minimum value of a product of less-probable-symbol occurrence probabilities in a case where less-probable-symbols occur successively.

The video encoding device is characterized in that: the estimation unit obtains the maximum value of the number of the arithmetic encoding output bits on the basis of one-symbol-unit calculation of a minimum value of less-probable-symbol occurrence probabilities, and plural-symbol-unit calculation of a minimum value of a product of less-probable-symbol occurrence probabilities in a case where less-probable-symbols occur successively.

The video encoding device comprises: a conversion-quantization unit for calculating transformed-quantized values of an image block by applying a frequency transformation followed by a quantization; and a non-entropy encoding unit for non-entropy-encoding the image of the image block and outputting obtained data: wherein, when the estimated bit number exceeds a predetermined value, the coded data decision unit decides a PCM mode header as syntax data that is outputted; and wherein, after the binary arithmetic encoding unit has encoded said PCM mode header and outputted it, said non-entropy encoding unit non-entropy-encodes the reconstructed image obtained by reconstructing said transformed-quantized values, or the input image of the image block for which said transformation-quantization has not been applied, and outputs obtained PCM data.

The present invention is a video encoding program causing a computer to execute: a binary-sequence conversion process of converting syntax data of an image block into a binary sequence; a binary arithmetic encoding process of encoding each symbol of the binary sequence subject to its corresponding context; an estimation process of estimating a bit number required for binary arithmetic encoding of the syntax data of the image block; and a coded data decision process of deciding whether or not to encode the syntax data of the image block in said binary arithmetic encoding process and to output it responding to the bit number estimated in said estimation process: wherein said video encoding program, in said coded data decision process, causes the computer to execute a context update process of updating said context corresponding to the syntax data of the image block decided to be encoded in said binary arithmetic encoding process and to be outputted in said coded data decision process, and not updating said context corresponding to the syntax data decided not to be encoded in said binary arithmetic encoding process and not to be outputted in said coded data decision process; and wherein said video encoding program, in said estimation process, causes the computer to execute a process of defining a maximum value of the number of binary arithmetic encoding output bits for its input symbols as said number of bits.

The video encoding program is characterized in that: the video encoding program, in the estimation process, causes the computer to execute a process of obtaining the maximum value of the number of the arithmetic encoding output bits on the basis of one-symbol-unit calculation of a minimum value of less-probable-symbol occurrence probabilities.

The video encoding program is characterized in that: the video encoding program, in the estimation process, causes the computer to execute a process of obtaining the maximum value of the number of the arithmetic encoding output bits on the basis of plural-symbol-unit calculation of a minimum value of a product of less-probable-symbol occurrence probabilities in a case where less-probable-symbols occur successively.

The video encoding program is characterized in that: the video encoding program, in the estimation process, causes the computer to execute a process of obtaining the maximum value of the number of the arithmetic encoding output bits on the basis of one-symbol-unit calculation of a minimum value of less-probable-symbol occurrence probabilities, and plural-symbol-unit calculation of a minimum value of a product of less-probable-symbol occurrence probabilities in a case where less-probable-symbols occur successively.

The video encoding program is characterized in that: the video encoding program causing the computer to execute: a conversion-quantization process of calculating transformed-quantized values of an image block by applying a frequency transformation followed by a quantization; and a non-entropy encoding process of non-entropy-encoding the image of the image block and outputting obtained data: wherein, said video encoding program, in the coded data decision process, causes the computer to execute a process of, when the estimated bit number exceeds a predetermined value, deciding a PCM mode header as syntax data that is outputted; and wherein said video encoding program, in said non-entropy encoding process, causes the computer to execute a process of, after said PCM mode header has been encoded in the binary arithmetic encoding process and outputted, encoding the reconstructed image obtained by reconstructing said transformed-quantized values, or the input image of the image block prior to said conversion-quantization process in said non-entropy encoding process, and outputting obtained PCM data.

Hereinafter, specific embodiments of the present invention will be explained by making a reference to the accompanied drawings.

Embodiment 1

Figure 2:
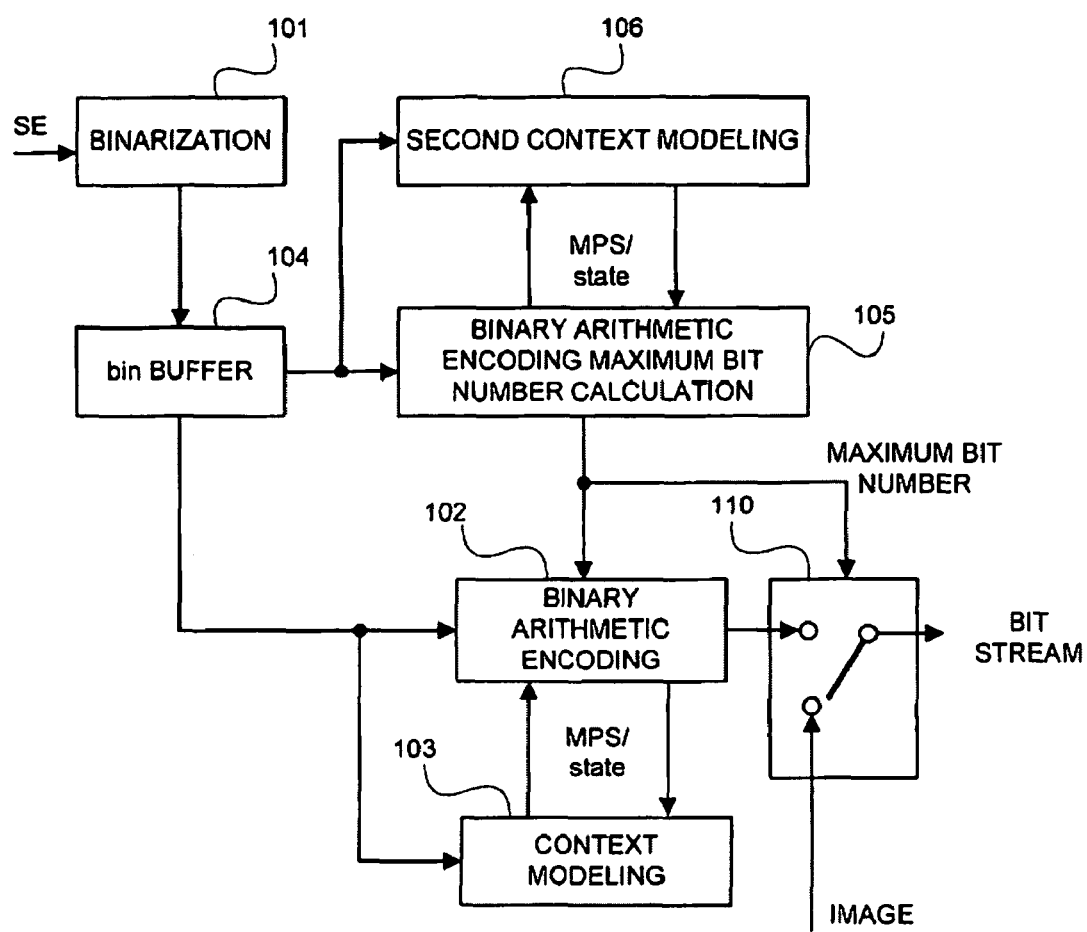
FIG. 2 is a block diagram illustrating a configuration of the entropy encoding unit for realizing the CABAC with the method of estimating the arithmetic encoding output bit number in the video encoder in the first embodiment of the present invention.
Figure 9:
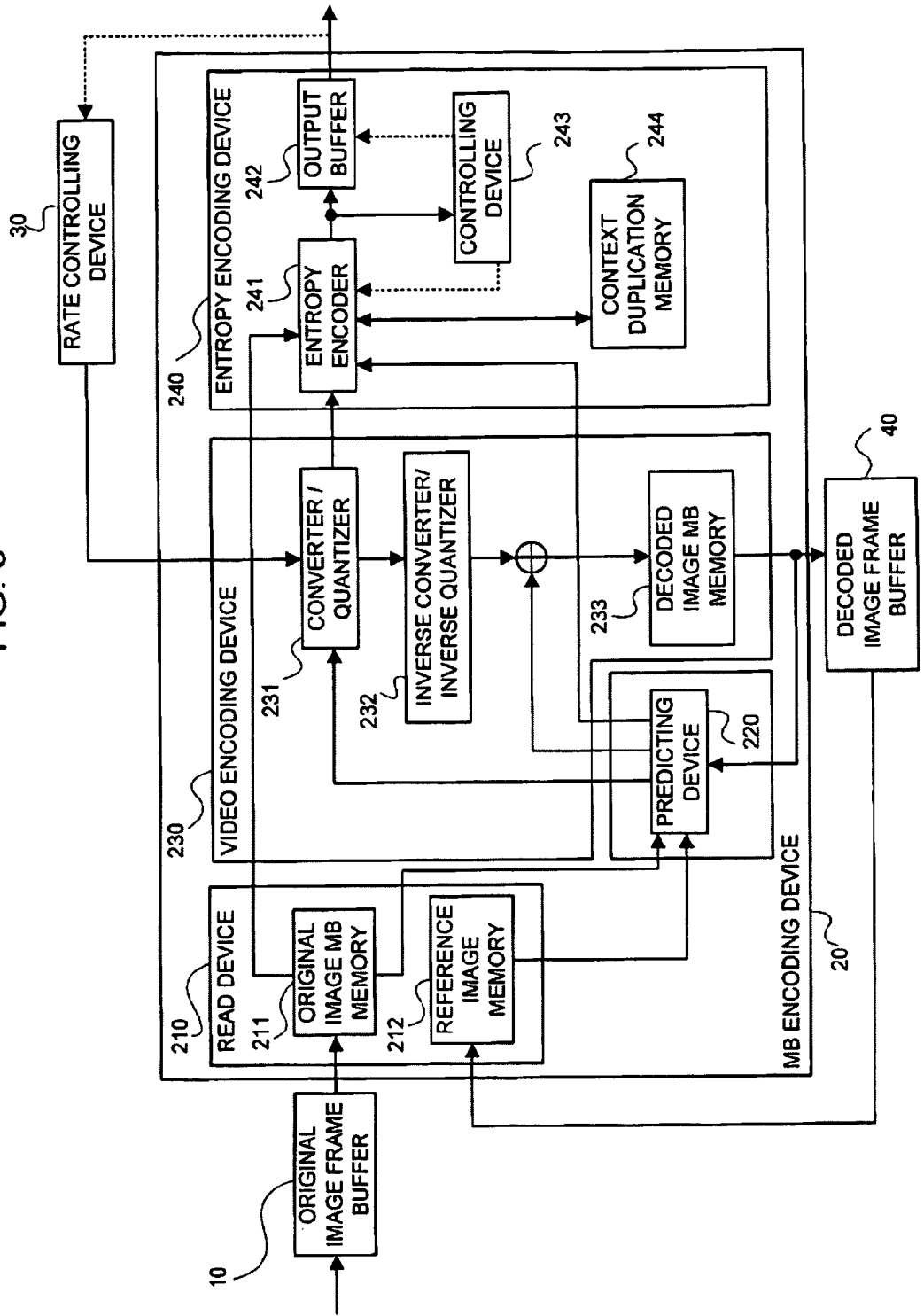
FIG. 9 is a block diagram for explaining a configuration of a general-purpose video encoding device.
Figure 10:
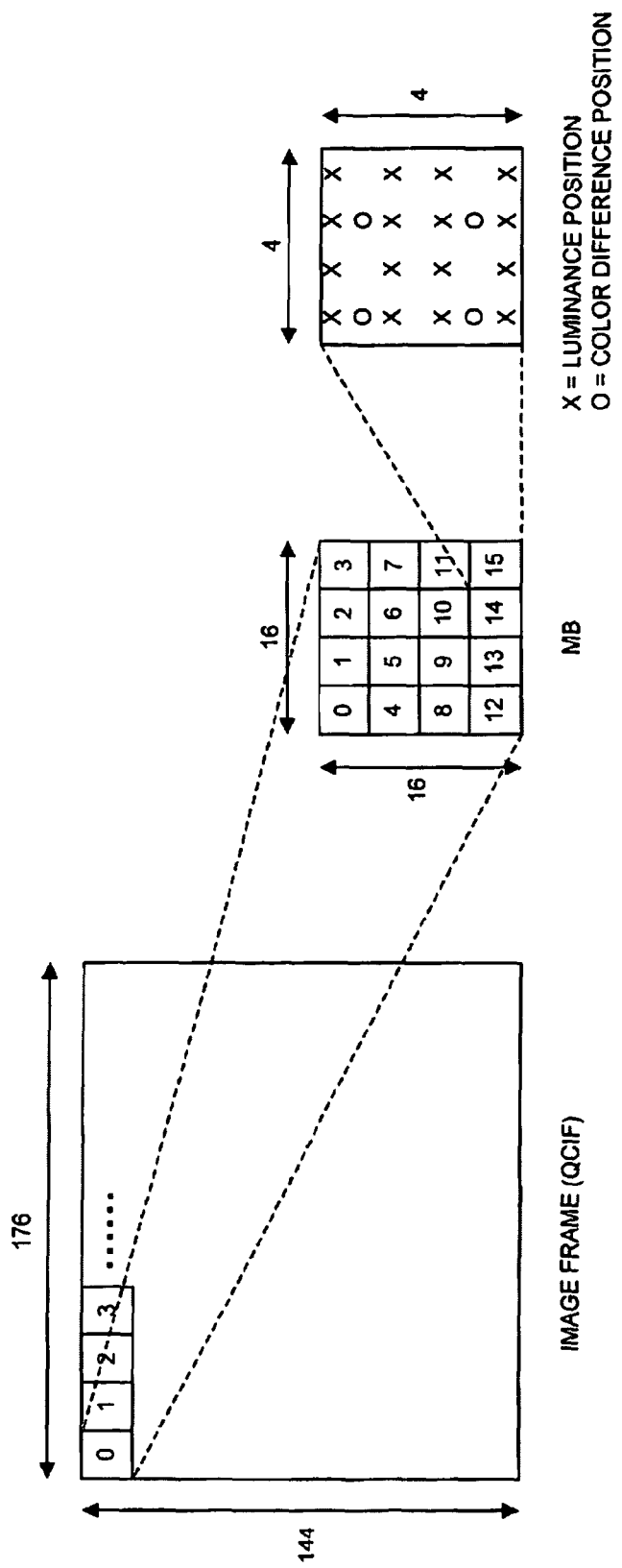
FIG. 10 is an explanatory view for explaining a configuration of an image frame (YUV420 format).
Figure 11:
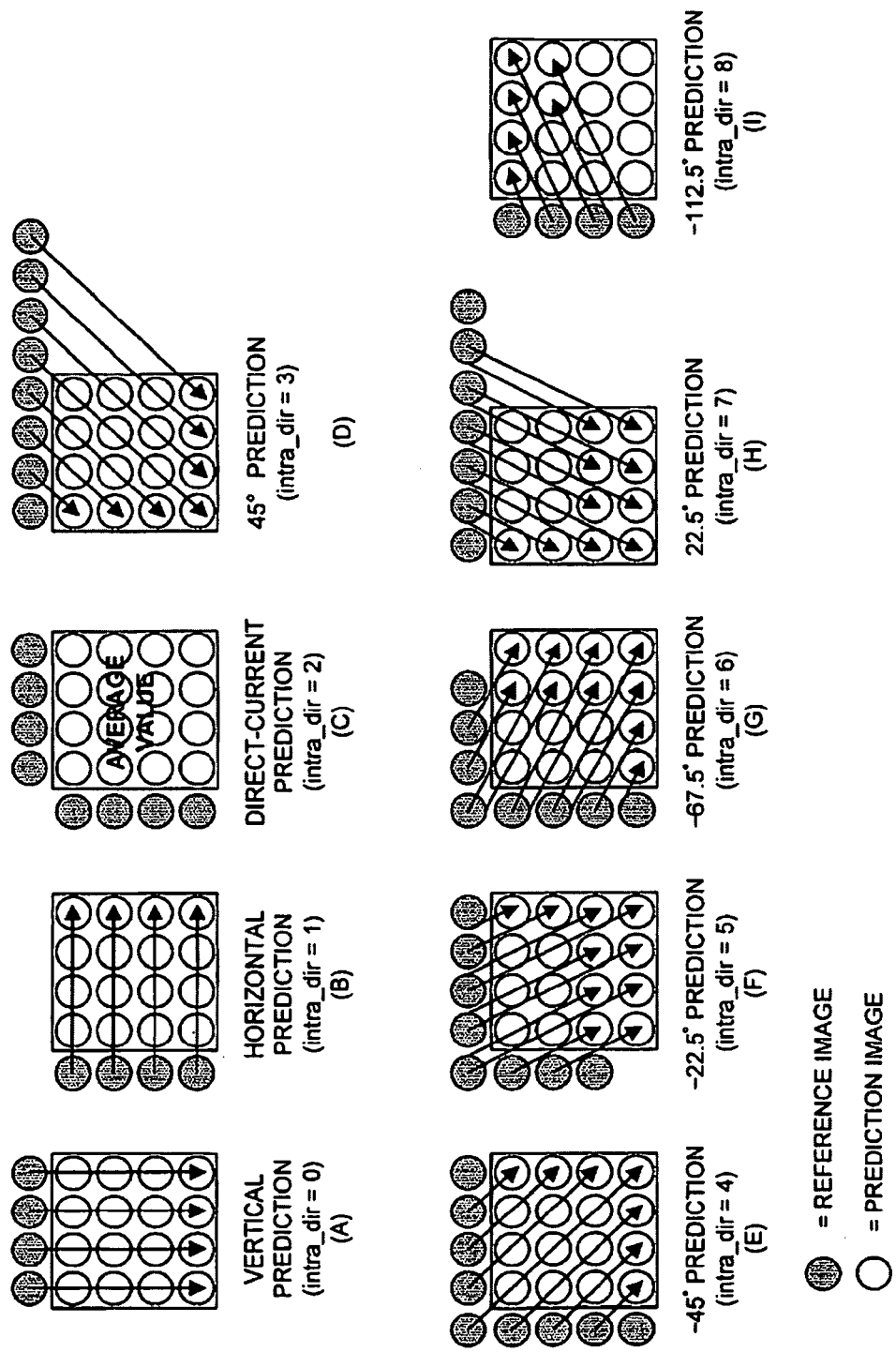
FIG. 11 is an explanatory view for explaining one example of the intra-frame prediction.
Figure 12:
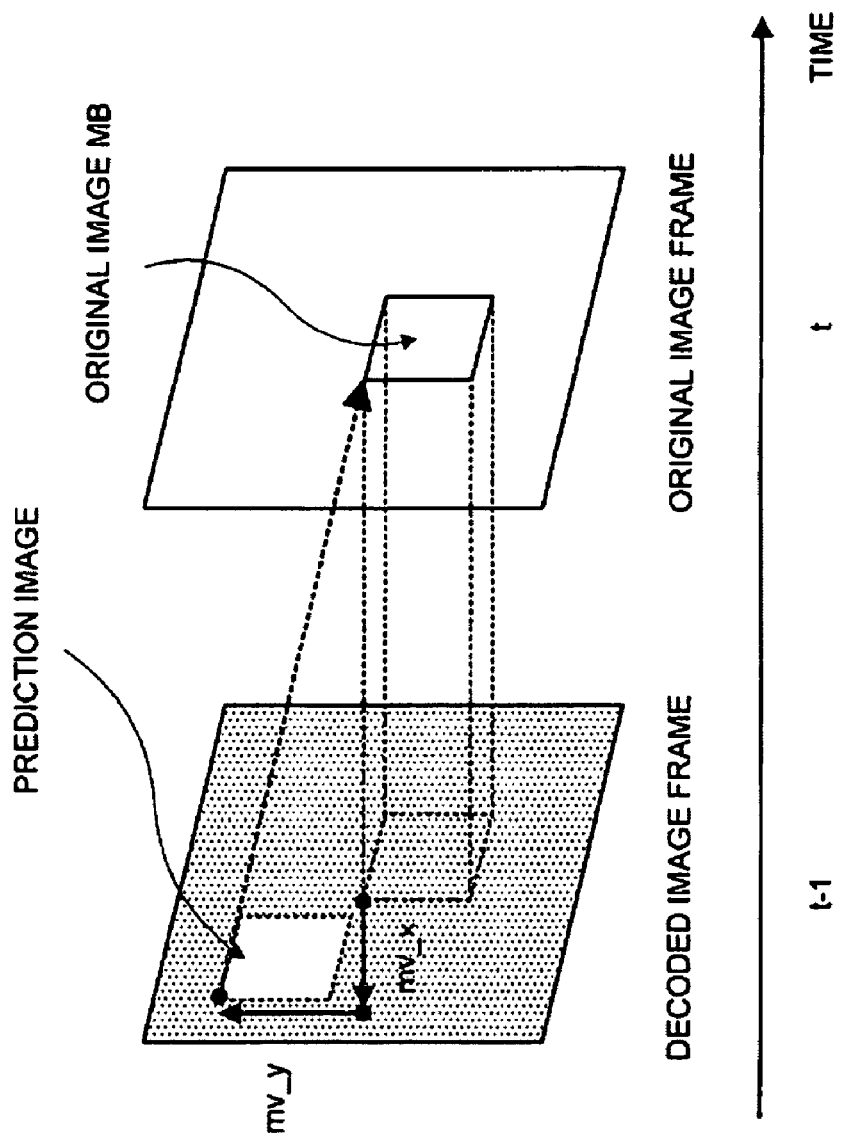
FIG. 12 is an explanatory view for explaining one example of the inter-frame prediction.
Figure 13:
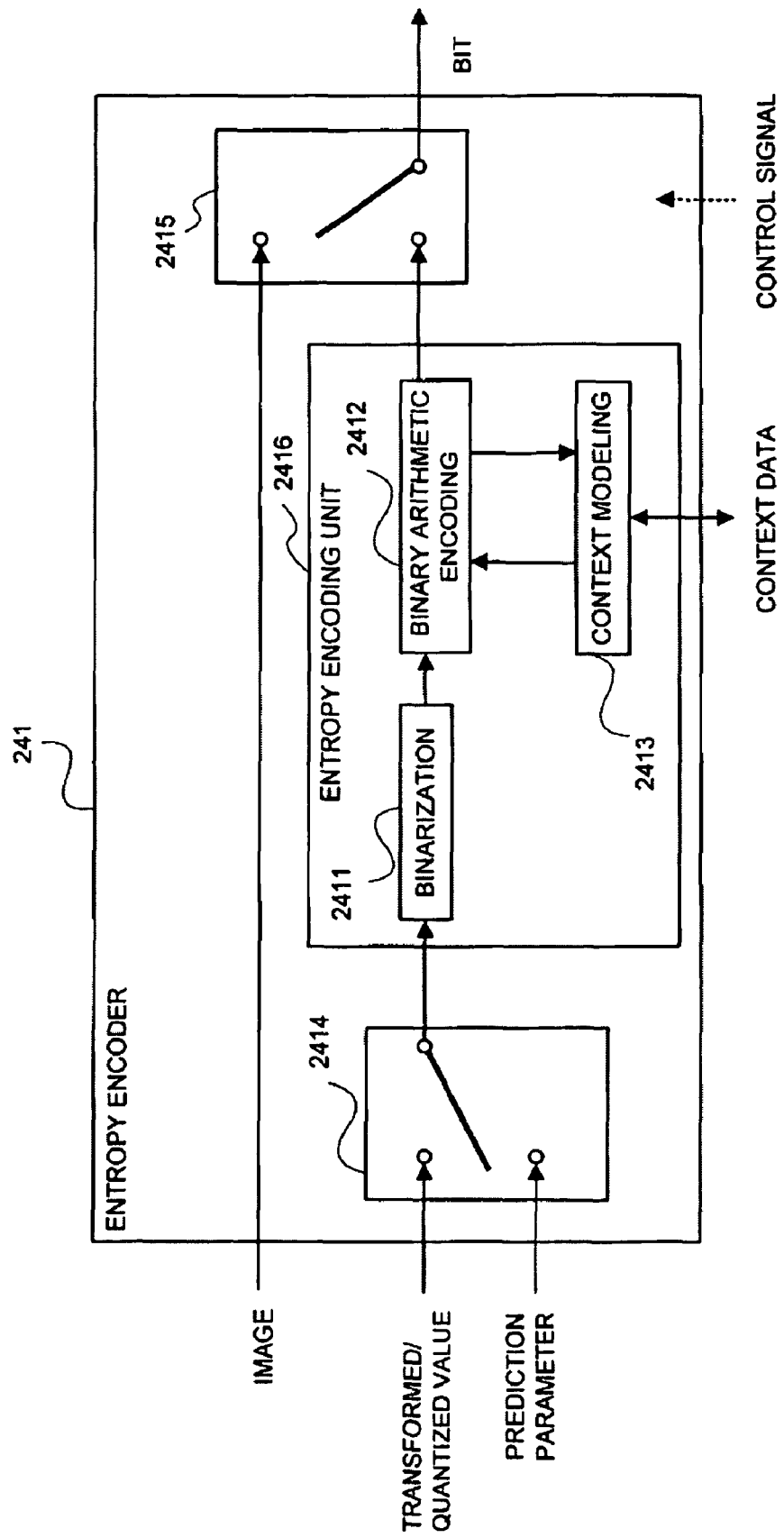
FIG. 13 is an explanatory view for explaining the PCM re-encoding.

FIG. 2 is a block diagram illustrating the entropy encoding unit for realizing the CABAC of this embodiment. The entropy encoding unit for realizing the CABAC of this embodiment, as compared with the entropy encoding unit shown in FIG. 14, further includes a bin buffer 104, a binary arithmetic encoding maximum bit number calculator 105, a second context modeler 106, and a switcher (PCM re-encoding switch) 110. Additionally, in this embodiment, the binary arithmetic encoder 102 has a function of deciding whether or not to subject the syntax data to the binary arithmetic encoding and to output it responding to the estimated bit number. Further, while each of the first to third embodiments differs from the other in a configuration of the entropy encoder 241, the entirety of a configuration of the video encoding device of each embodiment is identical to the configuration shown in FIG. 9.

Figure 14:
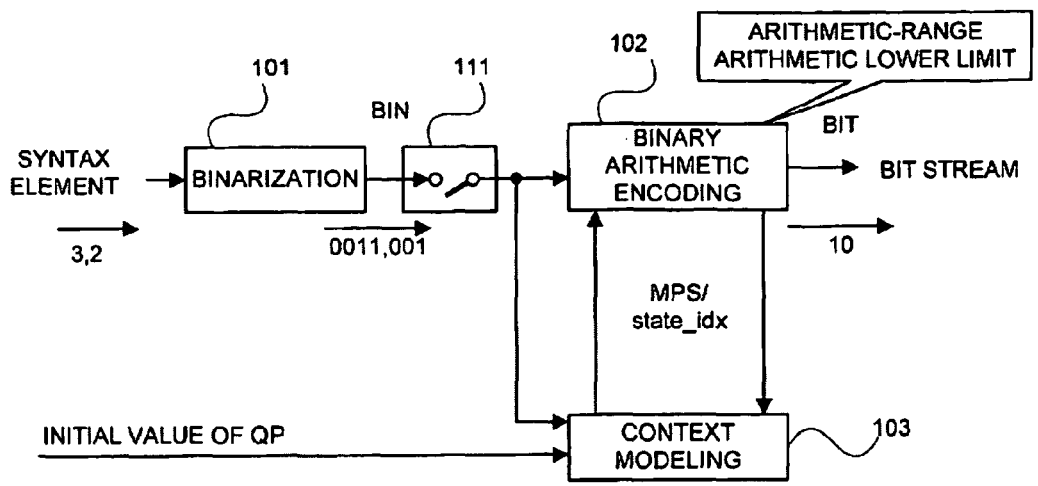
FIG. 14 is a block diagram illustrating a configuration of the general-purpose entropy encoding unit for realizing the CABAC.
Figure 15:
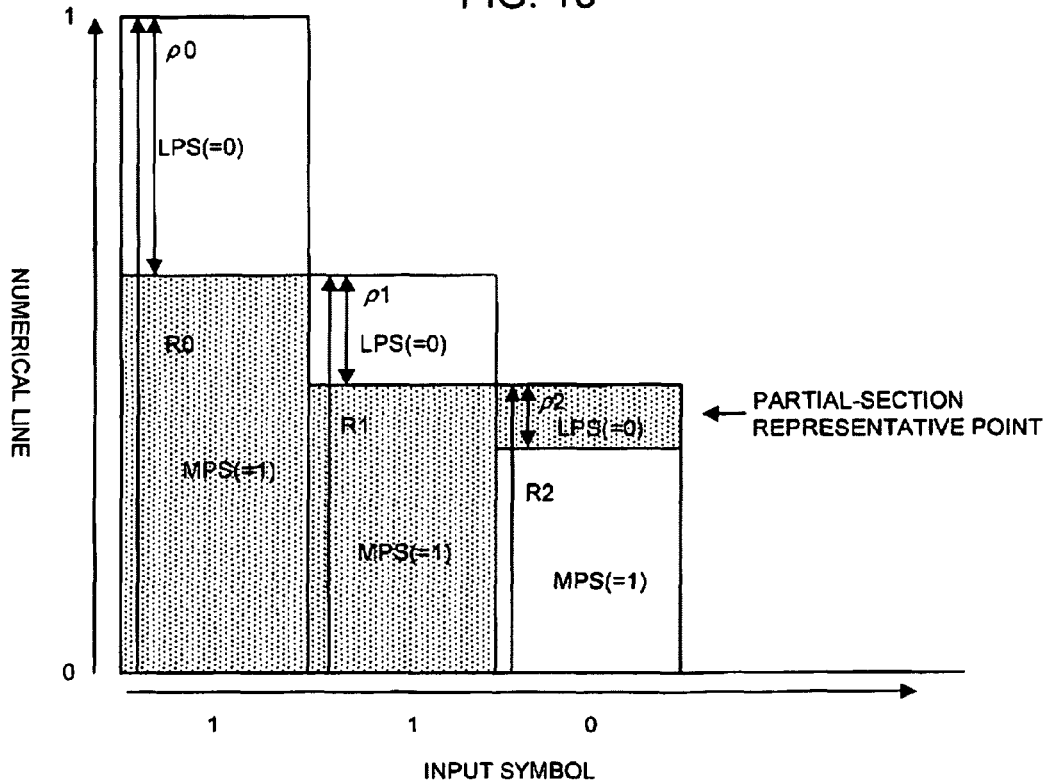
FIG. 15 is an explanatory view for explaining an operational example of the binary arithmetic encoding.

The binarizer 101, similarly to one shown in FIG. 14, converts the inputted SE of the MB layer into a binary sequence according to a rule stipulated with the specification (for example, H.264 specification). And, the binarizer 101 stores the binary sequence in the bin buffer 104. Next, the binary arithmetic encoding maximum bit number calculator 105 successively calculates the maximum value of the number of the arithmetic encoding output bits for each bin of the binary sequence stored in the bin buffer 104 with Equation 15 by utilizing the context that is supplied from the second context modeler 106, and outputs its accumulated value as a maximum bit number (equivalent to the estimated bit number that is required for the binary arithmetic encoding).

At the moment of the PCM re-encoding in the entropy encoding device, the basic operation is that the context data preserved in the context duplication memory 244 is loaded into the context modeler 103. Thereafter, the binarizer 101 generates the bin of the prediction parameter indicative of a commencement of the PCM, and supplies it to the binary arithmetic encoder 102. Simultaneously therewith, the context modeler 103 supplies the context data corresponding to the bin to the binary arithmetic encoder 102. The binary arithmetic encoder 102 subjects the bin to the arithmetic encoding by employing the context data, and returns the context data updated by the arithmetic encoding to the context modeler 103 while writing out the output bit to the output buffer 242 via the switcher 110. The binary arithmetic encoder 102, after finishing subjecting the bin of the prediction parameter indicative of a commencement of the PCM to the arithmetic encoding, loads the image stored in the original image MB memory 211, re-encodes it without changing a status of the PCM image, and writes out it to the output buffer 242.

In this embodiment, the binary arithmetic encoder 102 monitors the maximum bit number being supplied from the binary arithmetic encoding maximum bit number calculator 105, and similarly to one shown in FIG. 14, subjects each bin of the binary sequence stored in the bin buffer 104 to the binary arithmetic encoding by utilizing the context being supplied from the context modeler 103 when the maximum bit number is equal to or less than a predetermined threshold (for example, 3,200 bits). When the maximum bit number is more than the predetermined threshold, the binary arithmetic encoder 102 subjects only each bin of the binary sequence equivalent to the SE of the MB layer (PCM mode header) corresponding to the PCM encoding to the binary arithmetic encoding. By performing the process in such a manner, the context corresponding to the syntax data decided not to be encoded and not to be outputted is not updated, thereby making it possible to prevent the context necessary for subjecting the succeeding MB to the binary arithmetic encoding to be illegally updated.

The switcher 110 monitors the maximum bit number being supplied from the binary arithmetic encoding maximum bit number calculator 105, selects only an output of the binary arithmetic encoder 102 when the maximum bit number is equal to or less than the predetermined threshold, and supplies it to the outside as a bit stream. When the maximum bit number is more than the predetermined threshold, the switcher 110 supplies an output of the binary arithmetic encoder 102 (the binary arithmetic syntax data equivalent to the SE of the MB layer that corresponds to the PCM encoding) as a bit stream to the outside, and thereafter, selects the image data being supplied from the outside, thereby to define it as PCM data, and further supplies it as a bit stream to the outside. Additionally, in the H.264 specification, the PCM encoding is stipulated as non-entropy encoding. That is, the switcher 110, when selecting the image data being supplied from the outside, outputs the PCM data in which the image has been subjected to the non-entropy encoding.

What should be noticed herein is that the context stored in the second context modeler 106 and the context stored in the context modeler 104 are synchronous with each other at any time. That is, when the maximum bit number being supplied from the binary arithmetic encoding maximum bit number calculator 105 has exceeded the predetermined threshold, the entropy encoding unit updates the context stored in the second context modeler 106 by use of the context stored in the context modeler 104.

Additionally, the image data being supplied from the outside could be an original image data of the corresponding MB, and could be encoded image data, being a result of having encoded the corresponding MB.

Figure 3:
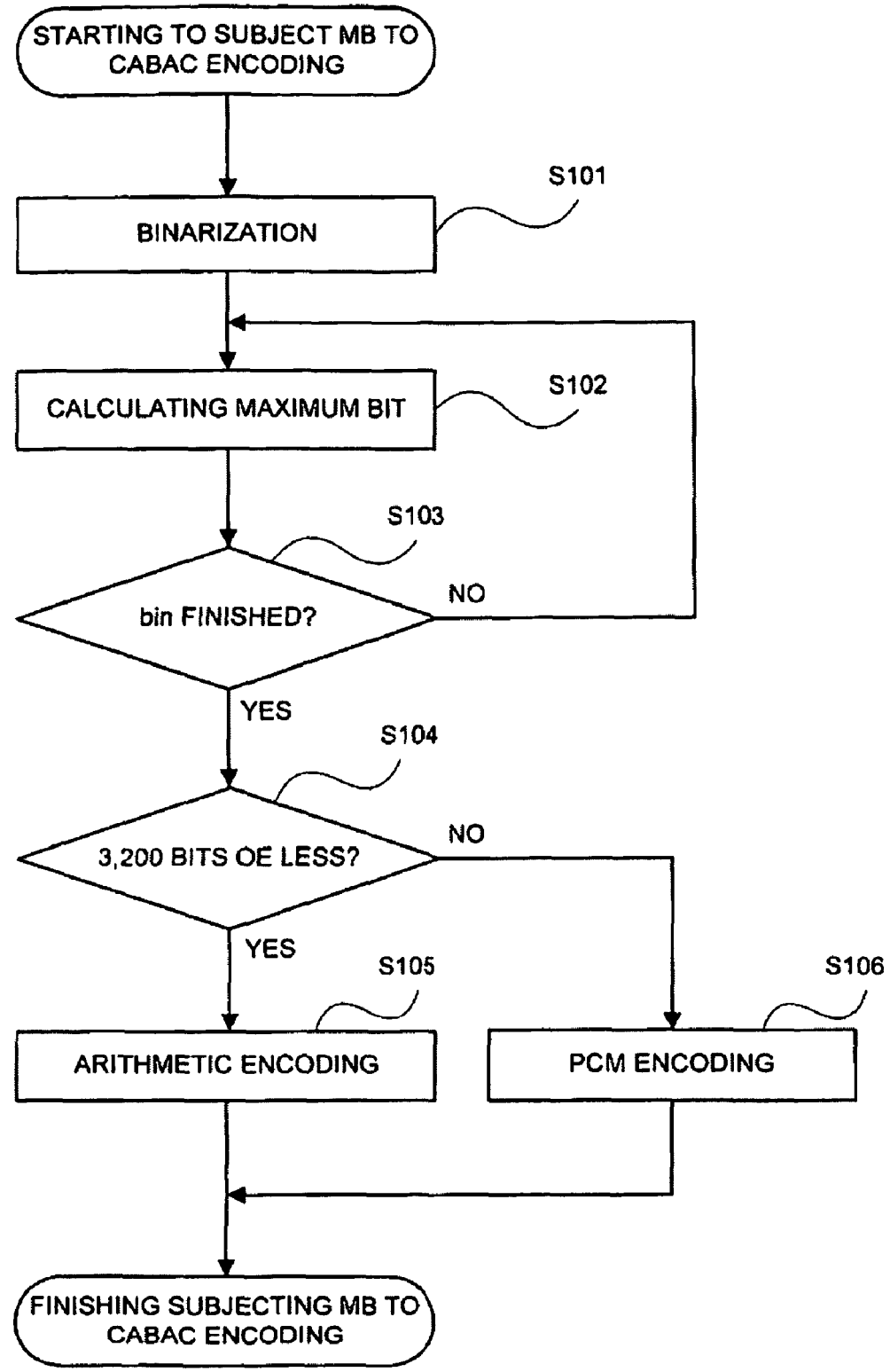
FIG. 3 is a flowchart illustrating an operation of the entropy encoding unit shown in FIG. 2.

Next, an operation of the entropy encoding unit for realizing the CABAC of this embodiment will be explained by making a reference to a flowchart of FIG. 3.

The entropy encoding unit of this embodiment initializes the value of an MB maximum bit counter (mb_max_bit) to zero at the moment of the CABAC of the MB layer SE. And, it performs six steps to be explained below after initialization.

In step S101, the binarizer 101 converts all SEs of the MB layer into a binary sequence according to a rule stipulated with the specification, and stores it in the bin buffer 104. And, the operation proceeds to step S102.

In the step S102, the binary arithmetic encoding maximum bit number calculator 105 calculates the maximum value of the arithmetic encoding output bits for each bin of the binary sequence stored in the bin buffer 104 with Equation 15 by employing the context being supplied from the second context modeler, and updates the MB maximum bit counter with Equation 19. And, the operation proceeds to step S103. Equation 19 is an equation for calculating the estimation of the encoding quantity in this embodiment.

$$mb\_max\_bit = mb\_max\_bit + cabac\_bits(i)$$ [Numerical equation 19]

In the step S103, the binary arithmetic encoding maximum bit number calculator 105 determines whether or not all of the process of the step S102 has been applied for each bin of the binary sequence stored in the bin buffer 104, the operation proceeds to step S104 when all of it has been applied, and the operation returns to the step S102 when it is not so. Additionally, the condition as to whether or not mb_max_bit exceeds 3,200 (a threshold) may be added as a condition under which the operation proceeds to the step S104.

In the step S104, the binary arithmetic encoder 102 determines whether or not mb_max_bit is 3,200 bits or less, the operation proceeds to step S105 when it is 3,200 bits or less, and the operation proceeds to step S106 when it is not so.

In the step S105, the binary arithmetic encoder 102 subjects each bin of the binary sequence stored in the bin buffer 104 to the binary arithmetic encoding by utilizing the context being supplied from the context modeler 103. After completing the binary arithmetic encoding for each bin of the binary sequence stored in the bin buffer 104, the CABAC process of the MB is finished.

In the step S106, the switcher 110 outputs the binary arithmetic syntax data equivalent to the SE of the MB layer that corresponds to the PCM encoding, and thereafter, outputs the image data as PCM data. Next, for the succeeding MB, the context stored in the second context modeler 106 is updated by employing the context stored in the context modeler 104, and thereafter, the CABAC process of the MB is finished.

As mentioned above, the process of the CABAC in this embodiment is executed. This embodiment is for taking a fluctuation in the output bit number due to the arithmetic range and the context into consideration and estimating the maximum value of the number of the arithmetic encoding output bits for one bin at a high precision. Thus, utilizing the entropy encoding unit for realizing the CABAC of this embodiment makes it possible to estimate the maximum value of the number of the arithmetic encoding output bits for each bin of the MB layer SE, and to take the encoding control at a high precision so that the MB output bit number becomes 3,200 bits or less.

Additionally, in this embodiment, besides the determination as to whether the MB maximum bit counter exceeds the predetermined value of 3,200 bits (step S104), the PCM encoding may be carried out like the case of the foregoing step S106 by taking a relation between the MB maximum bit counter and the encoding quantity being assigned by the rate controlling device 30 into consideration.

Embodiment 2

The maximum value of the arithmetic encoding output bit number was estimated in a one-bin unit at a high precision in the first embodiment (embodiment 1). In this embodiment, the CABAC further estimates the maximum value of the arithmetic encoding output bit number in a plural-bin unit, depending upon kinds of the SE of the MB layer. The merit of calculating the maximum value of the arithmetic encoding output bit number in a plural-bin unit lies in a point of reducing an overhead of the execution. However, it follows that the second embodiment over-evaluates the arithmetic encoding output bit number as compared with the case of the first embodiment.

It is desirable that the SE of the MB layer in which the maximum value of the arithmetic encoding output bit number is estimated in a plural-bin unit is an SE of a layer higher than a residual layer (see 7.3.4.3 of the Non-patent document 1). The reason is that, with regard to the SE of a layer higher than a residual layer, a ratio of the bin in the MB layer is small, and an influence upon the arithmetic encoding output bits of the entirety of the MB layer is comparatively small even though the maximum value of the arithmetic encoding output bit number is over-evaluated. However, needless to say, it is possible to make a switchover between the estimation of the maximum value of the arithmetic encoding output bit number in a one-bit unit and the estimation of the maximum value of the arithmetic encoding output bit number in a plural-bin unit in an arbitrary SE.

Additionally, the maximum value of the arithmetic encoding output bit number is preferably estimated in a one-bit unit at a high precision because the SE of significant_coeff_flag and last_significant_coeff_flag of the residual layer is an SE such that only one symbol is generated from one SE, and yet an SE such that the number is much in the MB layer as well.

A configuration of the entropy encoding unit for realizing the CABAC of this embodiment differs from that of the first embodiment only in a point that an internal configuration of the binary arithmetic encoding maximum bit number calculator 105 is changed. Thus, only the binary arithmetic encoding maximum bit number calculator 105, which is a difference with the first embodiment, will be explained.

Figure 4:
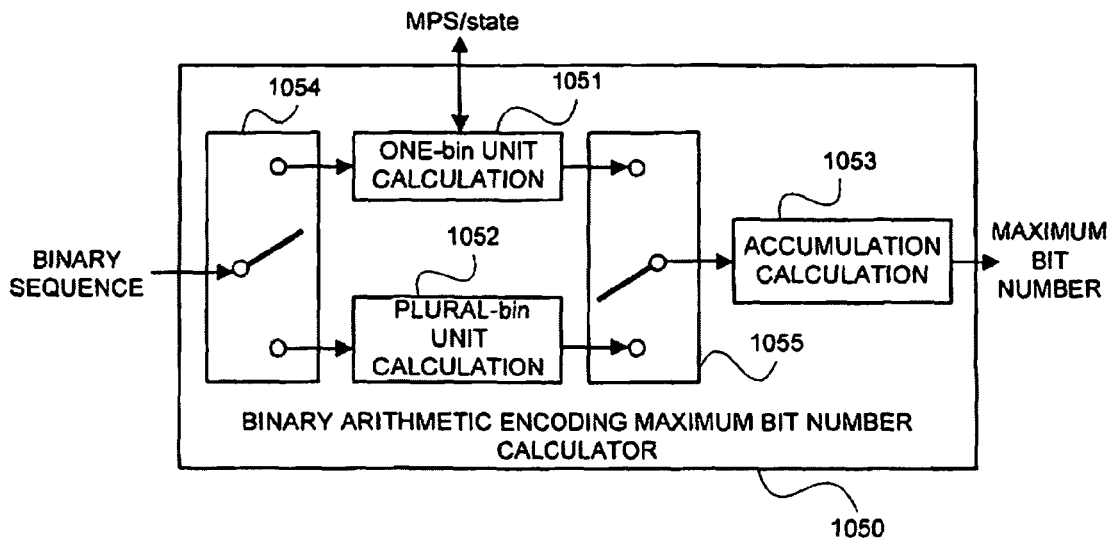
FIG. 4 is a block diagram illustrating a configuration of the binary arithmetic encoding maximum bit number calculator shown in a second embodiment of the present invention.

FIG. 4 is a block diagram illustrating a configuration of a binary arithmetic encoding maximum bit number calculator 1050 in this embodiment. As shown in FIG. 4, the binary arithmetic encoding maximum bit number calculator 1050 is configured of a switcher (unit calculator switch) 1054, a one-bin unit calculator 1051, a plural-bin unit calculator 1052, a switcher (accumulation calculator switch) 1055, and an accumulation calculator 1053.

When the SE of the binary sequence that is supplied from the outside (the bin buffer 104 shown in FIG. 2) is an SE for estimating the maximum value of the arithmetic encoding output bit number in a one-bit unit, the switcher 1054 supplies the binary sequence to the one-bin unit calculator 1051. When it is not so, the switcher 1054 supplies the binary sequence to the plural-bin unit calculator 1052.

The one-bin unit calculator 1051 successively calculates the maximum value of the arithmetic encoding output bits for each bin with Equation 15 by employing the context being supplied from the outside (the second context modeler 106 shown in FIG. 2), and outputs the calculated value to the accumulation calculator 1053 through the switcher 1055.

The plural-bin unit calculator 1052 successively calculates the maximum value of the number of the arithmetic encoding output bits for plural bins with Equation 16 or Equation 18 by employing the context being supplied from the outside (the second context modeler 106 shown in FIG. 2), and outputs the above maximum value to the accumulation calculator 1053 through the switcher 1055. Additionally, in this embodiment, a value of the context differs between the second context modeler 106 after the MB layer process and the context modeler 103 after the MB layer process. The reason is that state_idx is caused to transit on the assumption that the less-probable-symbol has continuously occurred in the context of the second context modeler 106.

After the accumulation calculator 1053 accumulates the maximum value of the arithmetic encoding output bits for one bin or plural bins that belongs to the SE of the MB layer, and finishes the process of the SE of the MB layer, it outputs the accumulated values to the outside (the binary arithmetic encoder 102 and the switcher 110 shown in FIG. 2).

Next, an operation of the binary arithmetic encoding maximum bit number calculator 1050 of this embodiment will be explained by making a reference to a flowchart of FIG. 5. While a process of the entirety of the entropy encoding unit for realizing the CABAC is identical to the process shown in a flowchart of FIG. 3, the process of the step S102 is replaced with a process shown in a flowchart of FIG. 4

In step S111, the switcher 1054 determines whether the SE of the binary sequence is an SE for estimating the maximum value of the arithmetic encoding output bit number in a one-bin unit (for example whether or not the above SE is an SE higher than the SE of the MB layer). When it is an SE for estimating the maximum value of the arithmetic encoding output bit number in a one-bin unit, the operation proceeds to step S112, and when it is not so, the operation proceeds to step S113.

In the step S112, the one-bin unit calculator 1051 successively calculates the maximum value of the arithmetic encoding output bits for each bin with Equation 15 by employing the context being supplied from the outside (the second context modeler 106 shown in FIG. 2), and finishes the process. In the step S113, the plural-bin unit Calculator 1052 successively calculates the maximum value of the number of the arithmetic encoding output bits for plural bins with Equation 16 or Equation 18 by employing the context being supplied from the outside (the second context modeler 106 shown in FIG. 2), and finishes the process.

The maximum value (the maximum value of the number of the arithmetic encoding output bits for one bin or plural bins) obtained in the step S112 or the step S113 is supplied to the outside, and the calculation of the binary arithmetic encoding maximum bit number for the binary sequence is finished.

Utilizing the CABAC of this embodiment makes it possible to estimate the maximum value of the number of the arithmetic encoding output bits for each bin of the MB layer SE at a high precision, and to take the encoding control at a high precision so that the MB output bit number becomes 3,200 bits or less. Further, estimating the maximum value of the arithmetic encoding output bit number in a plural-bin unit enables an overhead of the execution accompanying the estimation to be reduced.

While, in this embodiment, a switchover was made between the estimation of the maximum value of the arithmetic encoding output bit number in a one-bit unit and the estimation of the maximum value of the arithmetic encoding output bit number in a plural-bin unit according to the determination process of the step S111, the process of estimating the maximum value of the arithmetic encoding output bit number in a plural-bin unit may be performed at any time.

Embodiment 3

Figure 6:
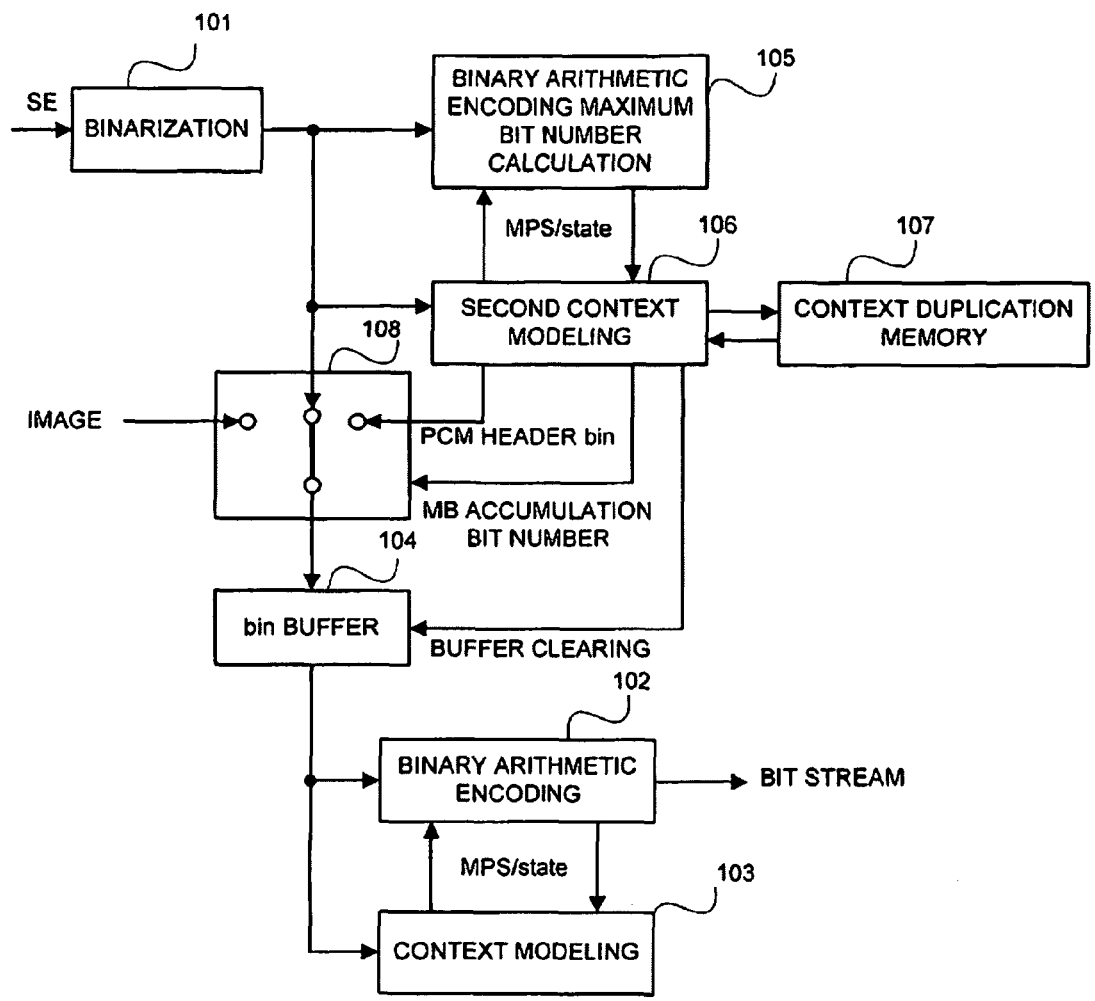
FIG. 6 is a block diagram illustrating a configuration of the entropy encoding unit for realizing the CABAC with the method of estimating the arithmetic encoding output bit number in the video encoder in a third embodiment of the present invention.

FIG. 6 is a block diagram illustrating the entropy encoding unit for realizing the CABAC of the third embodiment (embodiment 3). In this embodiment, the binary arithmetic encoding maximum bit number calculator 105 employs a technique similar to the technique that the binary arithmetic encoding maximum bit number calculator employed in any of the first embodiment (embodiment 1) and the second embodiment (embodiment 2). Herein, the binary arithmetic encoding maximum bit number calculator 105 similar to that of the first embodiment is exemplified.

The entropy encoding unit for realizing the CABAC of this embodiment, as compared with the entropy encoding unit shown in FIG. 14, further includes a bin buffer 104, a binary arithmetic encoding maximum bit number calculator 105, a second context modeler 106 and a switcher 108.

The binarizer 101 converts the SE of the MB layer being inputted into the binary sequence according to a rule stipulated with the specification, and stores it in the bin buffer 104. Next, the binary arithmetic encoding maximum bit number calculator 105 successively calculates the maximum value of the number of the arithmetic encoding output bits for each bin of the binary sequence stored in the bin buffer 104 by employing the context being supplied from the second context modeler 106. And, it compares the calculated accumulated value with the stipulation value of the MB bit number (for example, 3,200 bits). When the accumulated value has exceeded the stipulation value of the MB bit number, the binarizer 101 clears of the bin buffer 104 the output bin of the MB, and stores the bin of a header equivalent to the SE of the MB layer corresponding to the PCM encoding in the bin buffer 104.

The switcher 108 monitors the maximum bit number being supplied from the binary arithmetic encoding maximum bit number calculator 105, and selects only an output of the binarizer 101, and supplies it to the bin buffer 104 when the maximum bit number is equal to or less than the stipulation value of the MB maximum bit number. The switcher 108 supplies the bin of a header of the PCM encoding, thereafter selects the image data being supplied from the outside, and supplies it as PCM data to the bin buffer 104 when the maximum bit number is larger than the stipulation value of the MB maximum bit number.

After the binarizer 101 completes a one-MB operation, the binary arithmetic encoder 102 commences an operation, similarly to the case of entropy encoding unit shown in FIG. 14, subjects each bin of the binary sequence stored in the bin buffer 104 to the binary arithmetic encoding by utilizing the context being supplied from the context modeler 103. Delaying an operational commencement of the arithmetic encoding by one MB or more makes it possible to disperse the load of the binary arithmetic encoding upon an input bin rate by a factor of a several-MB unit responding to a capacity of the bin buffer 104.

In this embodiment, it is impossible to instantly make a copy to the second context modeler 106 at the moment of the PCM encoding in a situation where the MB maximum bit number is more than the stipulation value due to a delay in the process of the binary arithmetic encoder 102. For this, with regard to the context for calculating the output bit number by employing Equation 15, the binary arithmetic encoding maximum bit number calculator 105 pre-preserves the duplication coming from the second context modeler 106 in the first stage of the MB process, and continues to perform the binary encoding process by copying the duplicated context at the moment of the PCM encoding. Additionally, the image data being supplied from the outside could be original image data of the corresponding MB, and could be encoded image data, being a result of having encoded the corresponding MB.

Figure 7:
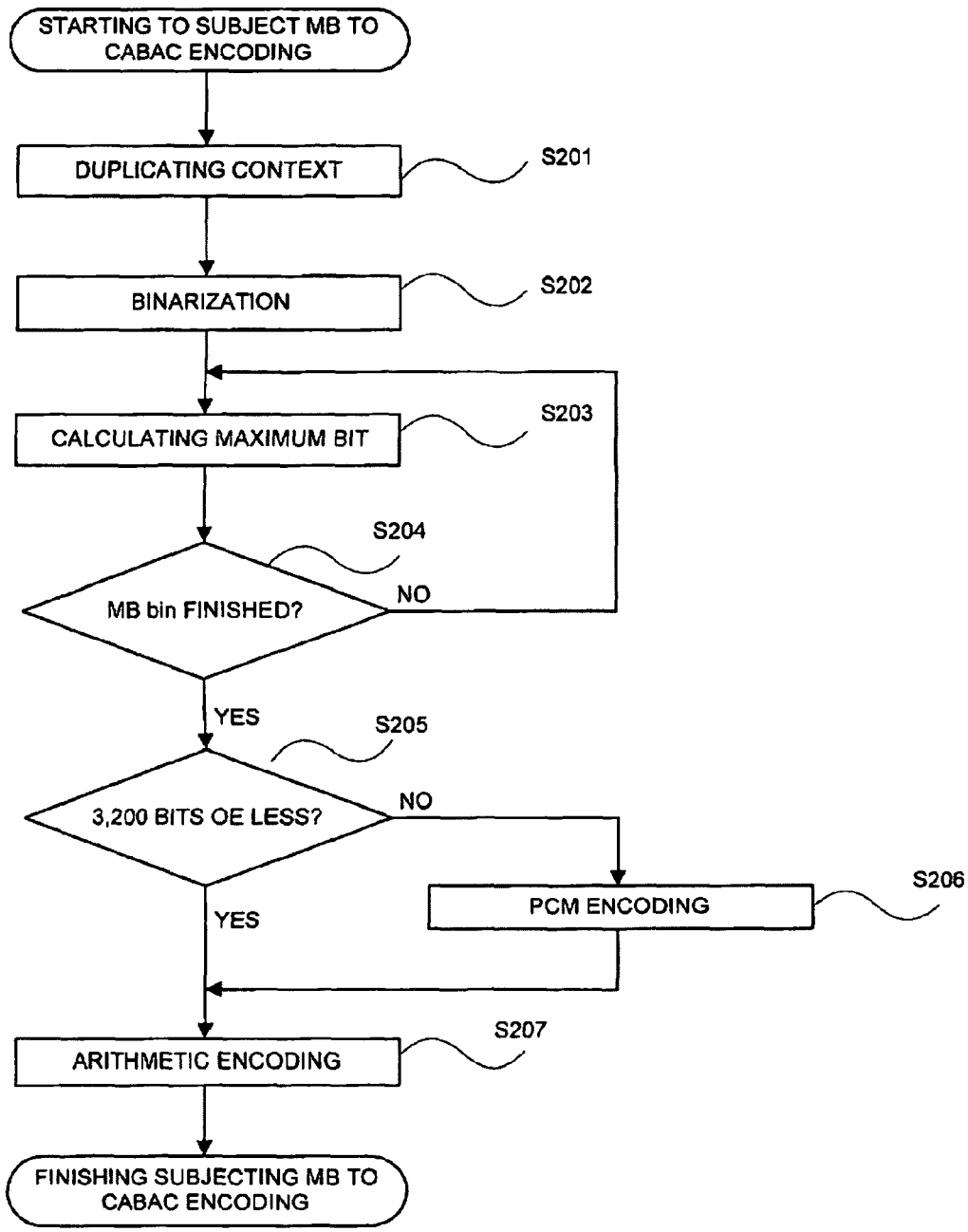
FIG. 7 is a flowchart illustrating an operation of the entropy encoding unit shown in FIG. 6.

Next, an operation of the entropy encoding unit for realizing the CABAC of this embodiment will be explained by making a reference to a flowchart of FIG. 7.

The entropy encoding unit of this embodiment initializes the value of an MB maximum bit counter (mb_max_bit) to zero at the moment of the CABAC of the MB layer SE. And, it performs seven steps to be explained below after initialization.

In step S201, the binary arithmetic encoding maximum bit number calculator 105 duplicates the context that the second context modeler 106 estimates with Equation 15 in the MB layer. And the operation proceeds to step S202. In the step S202, the binarizer 101 converts all SEs of the MB layer into the binary sequence according to a rule for stipulating the SE of the MB layer with the specification, and stores it in the bin buffer 104. And, the operation proceeds to step S203.

In the step S203, the binary arithmetic encoding maximum bit number calculator 105, similarly to the process of the step S102 in the first embodiment, calculates the maximum value of the arithmetic encoding output bits for each bin of the binary sequence stored in the bin buffer 104 with Equation 15 by employing the context being supplied from the second context modeler, and updates the MB maximum bit counter as shown in the Equation 19. And, the operation proceeds to step S204.

Figure 5:
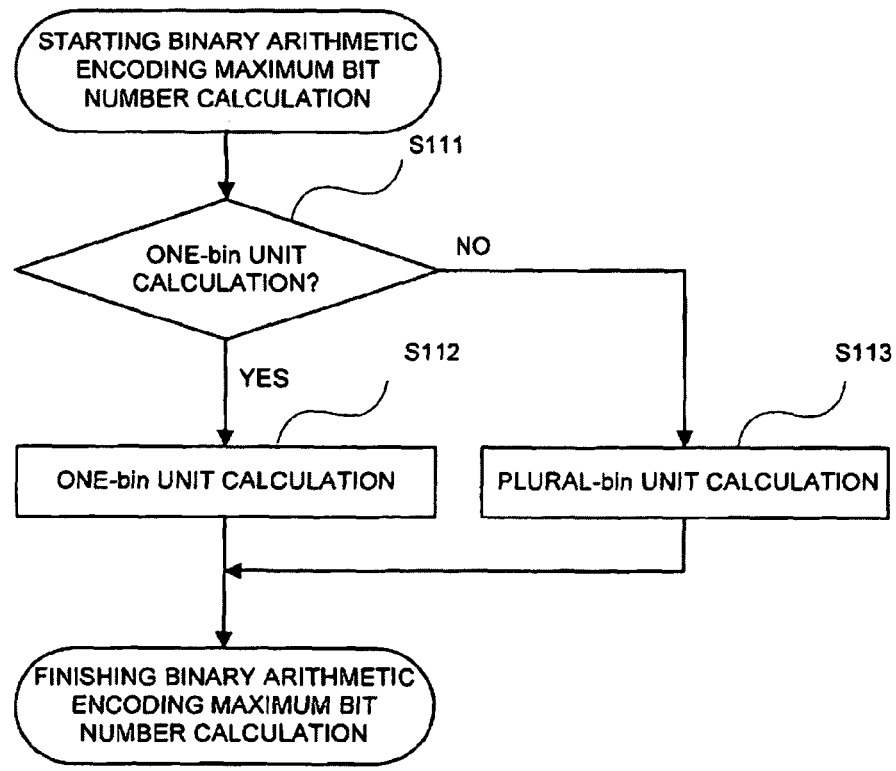
FIG. 5 is a flowchart illustrating an operation of the binary arithmetic encoding maximum bit number calculator shown in FIG. 4.

In the case of employing the binary arithmetic encoding maximum bit number calculator 1050 in the second embodiment, in the step S203, after a process similar to a flowchart of FIG. 5 is performed, the MB maximum bit counter is updated with Equation 19. And, the operation proceeds to step S204.

In the step S204, the binary arithmetic encoding maximum bit number calculator 105 determines whether or not all of the process of the step S203 has been applied for each bin of the binary sequence stored in the bin buffer 104, the operation proceeds to step S205 when all of the process has been applied, and the operation proceeds to the step S203 when it is not so. Additionally, the condition as to whether or not mb_max_bit exceeds 3,200 (threshold) may be added as a condition under which the operation proceeds to the step S205.

In the step S205, the binary arithmetic encoder 102 determines whether or not mb_max_bit is 3,200 bits or less, the operation proceeds to step S206 when it is 3,200 bits or less, and the operation proceeds to step S207 when it is not so.

In the step S206, after the binary arithmetic encoder 102 outputs the bin data equivalent to the SE of the MB layer that corresponds to the PCM encoding, it stores the image data as PCM data. Next, for the succeeding MB, the binary arithmetic encoder 102 updates the context stored in the second context modeler 106 by use of the context stored in the context duplication memory (second context duplication memory) 107, and carries out the context transit for the SE portion that corresponds to the PCM encoding, and the CABAC process of the MB is finished.

In the step S207, the binary arithmetic encoder 102 subjects each bin of the binary sequence stored in the bin buffer 104 to the binary arithmetic encoding by employing the context being supplied from the context modeler 103. After the binary arithmetic encoding for each bin of the binary sequence stored in the bin buffer 104 is completed, the CABAC process of the MB is finished. Additionally, in this embodiment, the process of the step S201 may be commenced with regard to the next MB prior to the completing of the process of the step S207.

As mentioned above, the process of the CABAC in this embodiment is performed. The present invention is preferredly applied to a process using a pipeline technique because, in this embodiment, the maximum value of the number of the arithmetic encoding output bits for each bin of the MB layer SE can be estimated at a high precision, and yet the processing load of the binary arithmetic encoding can be dispersed by a factor of a several-MB unit.

Figure 8:
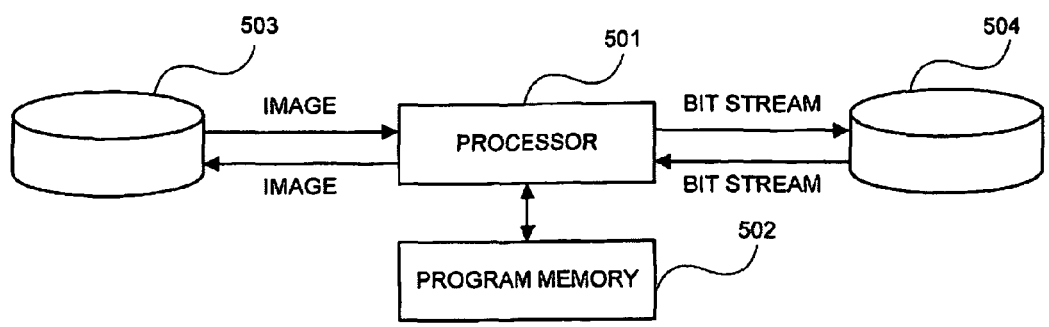
FIG. 8 is a block diagram illustrating a configuration of an information processing system capable of realizing the present invention.

As apparent from the above-mentioned explanation, while each of the above-mentioned embodiments can be configured with hardware, it also can be realized by employing a computer program. For example, an information processing system for realizing each of the above-mentioned embodiments shown in FIG. 8 includes a processor 501, a program memory 502, a storage medium 503 for storing the image data, and a storage medium 504 for storing the bit stream. The processor 501 performs the process shown in FIG. 3 (the first embodiment) and the process shown in FIG. 7 (the third embodiment) according to a program stored in the program memory 502. The processor 501, when realizing the second embodiment, performs the process shown in FIG. 3 or FIG. 7, and the process shown in FIG. 5. Additionally, a storage region of the storage medium 503 and a storage region of the storage medium 504 could be a storage region in a separate storage medium, and could be a storage region in an identical storage medium. Further, a magnetic storage medium such as a hard disc can be employed as the storage medium 503 and the storage medium 504.

HOW THE INVENTION IS CAPABLE OF INDUSTRIAL EXPLOITATION

The present invention is preferredly applied to the video encoding device employing the CABAC based upon the method of estimating the arithmetic encoding output bit number.

The invention claimed is:

1. A video encoding method, comprising:
   a binary-sequence conversion step of converting syntax data of an image block into a binary sequence;
   a binary arithmetic encoding step of encoding each symbol of the binary sequence subject to its corresponding context;
   an estimation step of estimating a bit number required for binary arithmetic encoding of the syntax data of the image block;
   a coded data decision step of deciding whether or not to encode said syntax data of the image block in said binary arithmetic encoding step and to output it responding to the bit number estimated in said estimation step; and
   a context update step of updating said context corresponding to the syntax data of the image block decided to be encoded in said binary arithmetic encoding step and to be outputted in said coded data decision step, and not updating said context corresponding to the syntax data of the image block not to be encoded in said binary arithmetic encoding step and not to be outputted in said coded data decision step,
   wherein, in said estimation step, a maximum value of the number of binary arithmetic encoding output bits for its input symbols is defined as said number of bits; and
   wherein, in the estimation step, the maximum value of the number of the arithmetic encoding output bits is obtained on the basis of one-symbol-unit calculation of a minimum value of less-probable-symbol occurrence probabilities, and plural-symbol-unit calculation of a minimum value of a product of less-probable-symbol occurrence probabilities in a case where less-probable-symbols occur successively.

2. A video encoding method according to claim 1;
   wherein, in the estimation step, the maximum value of the number of the arithmetic encoding output bits is obtained on the basis of one-symbol-unit calculation of a minimum value of less-probable-symbol occurrence probabilities.

3. A video encoding method according to claim 1;
   wherein, in the estimation step, the maximum value of the number of the arithmetic encoding output bits is obtained on the basis of plural-symbol-unit calculation of a minimum value of a product of less-probable-symbol occurrence probabilities in a case where less-probable-symbols occur successively.

4. A video encoding method according to claim 1, said video encoding method comprising:
   a conversion-quantization step of calculating transformed-quantized values of an image block by applying a frequency transformation followed by a quantization; and
   a non-entropy encoding step of non-entropy-encoding the image of the image block and outputting obtained data:
   wherein, in the coded data decision step, when the estimated bit number exceeds a predetermined value, a PCM mode header is decided as syntax data that is outputted; and
   wherein, after said PCM mode header has been encoded in the binary arithmetic encoding step and outputted, the reconstructed image obtained by reconstructing said transformed-quantized values, or the input image of the image block prior to said conversion-quantization step is encoded in said non-entropy encoding step and obtained PCM data is outputted.

5. A video encoding device, comprising:
   a binary-sequence conversion unit for converting syntax data of an image block into a binary sequence;
   a binary arithmetic encoding unit for encoding each symbol of the binary sequence subject to its corresponding context;
   an estimation unit for estimating a bit number required for binary arithmetic encoding of the syntax data of the image block;
   a coded data decision unit for deciding whether or not said binary arithmetic encoding unit encodes the syntax data of the image block and outputs it responding to the bit number estimated by said estimation unit; and
   a context update unit for updating said context corresponding to the syntax data of the image block that said coded data decision unit has decided to encode and to output, and not updating said context corresponding to the syntax data that said coded data decision unit has decided not to encode and not to output,
   wherein said estimation unit defines a maximum value of the number of binary arithmetic encoding output bits for its input symbols as said number of bits; and
   wherein the estimation unit obtains the maximum value of the number of the arithmetic encoding output bits on the basis of one-symbol-unit calculation of a minimum value of less-probable-symbol occurrence probabilities, and plural-symbol-unit calculation of a minimum value of a product of less-probable-symbol occurrence probabilities in a case where less-probable-symbols occur successively.

6. A video encoding device according to claim 5;
   wherein the estimation unit obtains the maximum value of the number of the arithmetic encoding output bits on the basis of one-symbol-unit calculation of a minimum value of less-probable-symbol occurrence probabilities.

7. A video encoding device according to claim 5;
   wherein the estimation unit obtains the maximum value of the number of the arithmetic encoding output bits on the basis of plural-symbol-unit calculation of a minimum value of a product of less-probable-symbol occurrence probabilities in a case where less-probable-symbols occur successively.

8. A video encoding device according to claim 5, said video encoding device comprising:
   a conversion-quantization unit for calculating transformed-quantized values of an image block by applying a frequency transformation followed by a quantization; and
   a non-entropy encoding unit for non-entropy-encoding the image of the image block and outputting obtained data:
   wherein, when the estimated bit number exceeds a predetermined value, the coded data decision unit decides a PCM mode header as syntax data that is outputted; and
   wherein, after the binary arithmetic encoding unit has encoded said PCM mode header and outputted it, said non-entropy encoding unit non-entropy-encodes the reconstructed image obtained by reconstructing said transformed-quantized values, or the input image of the image block for which said transformation-quantization has not been applied, and outputs obtained PCM data.

9. A non-transitory recording medium storing a video encoding program, said video encoding program causing a computer to execute:
   a binary-sequence conversion process of converting syntax data of an image block into a binary sequence;
   a binary arithmetic encoding process of encoding each symbol of the binary sequence subject to its corresponding context;

an estimation process of estimating a bit number required for binary arithmetic encoding of the syntax data of the image block; and a coded data decision process of deciding whether or not to encode the syntax data of the image block in said binary arithmetic encoding process and to output it responding to the bit number estimated in said estimation process:

wherein said video encoding program, in said coded data decision process, causes the computer to execute a context update process of updating said context corresponding to the syntax data of the image block decided to be encoded in said binary arithmetic encoding process and to be outputted in said coded data decision process, and not updating said context corresponding to the syntax data decided not to be encoded in said binary arithmetic encoding process and not to be outputted in said coded data decision process;

wherein said video encoding program, in said estimation process, causes the computer to execute a process of defining a maximum value of the number of binary arithmetic encoding output bits for its input symbols as said number of bits; and wherein said video encoding program, in the estimation process, causes the computer to execute a process of obtaining the maximum value of the number of the arithmetic encoding output bits on the basis of one-symbol-unit calculation of a minimum value of less-probable-symbol occurrence probabilities, and plural-symbol-unit calculation of a minimum value of a product of less-probable-symbol occurrence probabilities in a case where less-probable-symbols occur successively.

10. A non-transitory recording medium according to claim 9, wherein said video encoding program, in the estimation process, causes the computer to execute a process of obtaining the maximum value of the number of the arithmetic encoding output bits on the basis of one-symbol-unit calculation of a minimum value of less-probable-symbol occurrence probabilities.

11. A non-transitory recording medium according to claim 9, wherein said video encoding program, in the estimation process, causes the computer to execute a process of obtaining the maximum value of the number of the arithmetic encoding output bits on the basis of plural-symbol-unit calculation of a minimum value of a product of less-probable-symbol occurrence probabilities in a case where less-probable-symbols occur successively.

12. A non-transitory recording medium according to claim 9, said video encoding program causing the computer to execute:

a conversion-quantization process of calculating transformed-quantized values of an image block by applying a frequency transformation followed by a quantization; and a non-entropy encoding process of non-entropy-encoding the image of the image block and outputting obtained data:

wherein, said video encoding program, in the coded data decision process, causes the computer to execute a process of, when the estimated bit number exceeds a predetermined value, deciding a PCM mode header as syntax data that is outputted; and wherein said video encoding program, in said non-entropy encoding process, causes the computer to execute a process of, after said PCM mode header has been encoded in the binary arithmetic encoding process and outputted, encoding the reconstructed image obtained by reconstructing said transformed-quantized values, or the input image of the image block prior to said conversion-quantization process in said non-entropy encoding process, and outputting obtained PCM data.

* * * * *